(12) United States Patent
Kakoiyama et al.

(10) Patent No.: US 12,181,659 B2
(45) Date of Patent: Dec. 31, 2024

(54) LIGHT REFLECTING ELEMENT AND SPATIAL LIGHT MODULATOR

(71) Applicant: SONY SEMICONDUCTOR SOLUTIONS CORPORATION, Kanagawa (JP)

(72) Inventors: Naoki Kakoiyama, Tokyo (JP); Daisuke Saito, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 637 days.

(21) Appl. No.: 17/413,624

(22) PCT Filed: Dec. 6, 2019

(86) PCT No.: PCT/JP2019/047860
§ 371 (c)(1),
(2) Date: Jun. 14, 2021

(87) PCT Pub. No.: WO2020/129708
PCT Pub. Date: Jun. 25, 2020

(65) Prior Publication Data
US 2022/0075178 A1    Mar. 10, 2022

(30) Foreign Application Priority Data
Dec. 21, 2018    (JP) .................................. 2018-239618

(51) Int. Cl.
*G02B 26/08*    (2006.01)
*B81B 3/00*    (2006.01)

(52) U.S. Cl.
CPC ........ *G02B 26/0833* (2013.01); *B81B 3/0037* (2013.01); *B81B 3/0048* (2013.01); *B81B 3/0072* (2013.01)

(58) Field of Classification Search
CPC ................................................. G02B 26/0841
See application file for complete search history.

(56) References Cited

U.S. PATENT DOCUMENTS 6,804,039 B1    10/2004    Doan
6,862,127 B1    3/2005    Ishii
(Continued)

FOREIGN PATENT DOCUMENTS

CN    101029965 A    9/2007
CN    101084462 A    12/2007
(Continued)

OTHER PUBLICATIONS

International Search Report prepared by the Japan Patent Office on Jan. 17, 2020, for International Application No. PCT/JP2019/047860.

*Primary Examiner* — Moazzam Hossain
(74) *Attorney, Agent, or Firm* — SHERIDAN ROSS P.C.

(57) ABSTRACT

Provided is a light reflecting element including a support portion, a hinge portion, and a light reflecting portion, in which the light reflecting portion includes a support layer and a light reflecting layer, the hinge portion includes a torsion bar portion, extending portions extending from side portions of the torsion bar portion, and movable pieces extending from end portions of the extending portions, an end portion of the torsion bar portion is fixed to the support portion, the hinge portion is twistedly deformable around an axis of the torsion bar portion, the support layer is fixed to the movable pieces, and a recessed portion is provided at least at a portion of the support layer facing a space located between the first movable piece and the second movable piece.

20 Claims, 22 Drawing Sheets

(56) References Cited

U.S. PATENT DOCUMENTS

| | | | |
|---|---|---|---|
| 2006/0050353 | A1 | 3/2006 | Huibers et al. |
| 2006/0126152 | A1 | 6/2006 | Pan |
| 2007/0121192 | A1 | 5/2007 | Lee et al. |
| 2022/0075178 | A1* | 3/2022 | Kakoiyama ............... B81B 3/00 |

FOREIGN PATENT DOCUMENTS

| | | |
|---|---|---|
| JP | 2007-514183 | 5/2007 |
| JP | 2007-156466 | 6/2007 |
| JP | 2013068678 A | 4/2013 |
| JP | 2017-068213 | 4/2017 |
| WO | WO-2005045477 A2 | 5/2005 |

\* cited by examiner

LIGHT REFLECTING ELEMENT AND SPATIAL LIGHT MODULATOR

CROSS REFERENCE TO RELATED APPLICATIONS

This application is a national stage application under 35 U.S.C. 371 and claims the benefit of PCT Application No. PCT/JP2019/047860 having an international filing date of 6 Dec. 2019, which designated the United States, which PCT application claimed the benefit of Japanese Patent Application No. 2018-239618 filed 21 Dec. 2018, the entire disclosures of each of which are incorporated herein by reference.

TECHNICAL FIELD

The present disclosure relates to a light reflecting element and a spatial light modulator including a plurality of such light reflecting elements.

BACKGROUND ART

A spatial light modulator provided with a plurality of light reflecting elements is often used as a projector and an image display device. For example, a light reflecting element disclosed in U.S. Patent Application Publication No. 2006/0050353 A1 is configured of: a post provided on a substrate; a band-shaped hinge having both ends fixed to the post; a hinge contact having one end attached to a central portion of the hinge; and a mirror plate attached to the other end of the hinge contact, in which a trench is formed at a portion of the mirror plate (a light reflecting surface) facing the hinge, light enters the mirror plate of the light reflecting element via the substrate, and the light reflected by the mirror plate is emitted to the outside via the substrate.

CITATION LIST

Patent Literature

[PTL 1]
U.S. Patent Application Publication No. 2006/0050353 A1

SUMMARY

Technical Problem

Incidentally, in the light reflecting element disclosed in the above-mentioned U.S. Patent Application Publication, since the trench is formed in the central portion of the light reflecting surface of the mirror plate, rigidity of the entire mirror plate is low, warpage is likely to occur in the mirror plate due to thermal stress, and an area of the light reflecting surface of the mirror plate is reduced by an amount of the trench. Therefore, there is a problem that light reflection efficiency and a contrast of the light reflecting element are lowered.

Therefore, an object of the present disclosure is to provide a light reflecting element having a configuration and a structure in which warpage is unlikely to occur and an area of a light reflecting surface can be made as large as possible, and a spatial light modulator having a plurality of such light reflecting elements.

Solution to Problem

A light reflecting element of the present disclosure for achieving the above object including a support portion provided on a base body, a hinge portion, and a light reflecting portion, in which the light reflecting portion includes a support layer, and a light reflecting layer formed on the support layer, the hinge portion includes a torsion bar portion, a first extending portion extending from a portion of one side portion of the torsion bar portion, a first movable piece extending from an end portion of the first extending portion, a second extending portion extending from a portion of the other side portion of the torsion bar portion, and a second movable piece extending from an end portion of the second extending portion, an end portion of the torsion bar portion is fixed to the support portion, the hinge portion is twistedly deformable around an axis of the torsion bar portion, the support layer is formed to extend from the first movable piece to the second movable piece, and a recessed portion is provided at least at a portion of the support layer facing a space located between the first movable piece and the second movable piece.

A spatial light modulator of the present disclosure for achieving the above object is a spatial light modulator in which light reflecting elements are arranged in an array, in which each light reflecting element is configured of the light reflecting element of the present disclosure.

DESCRIPTION OF EMBODIMENTS

Figure 1:
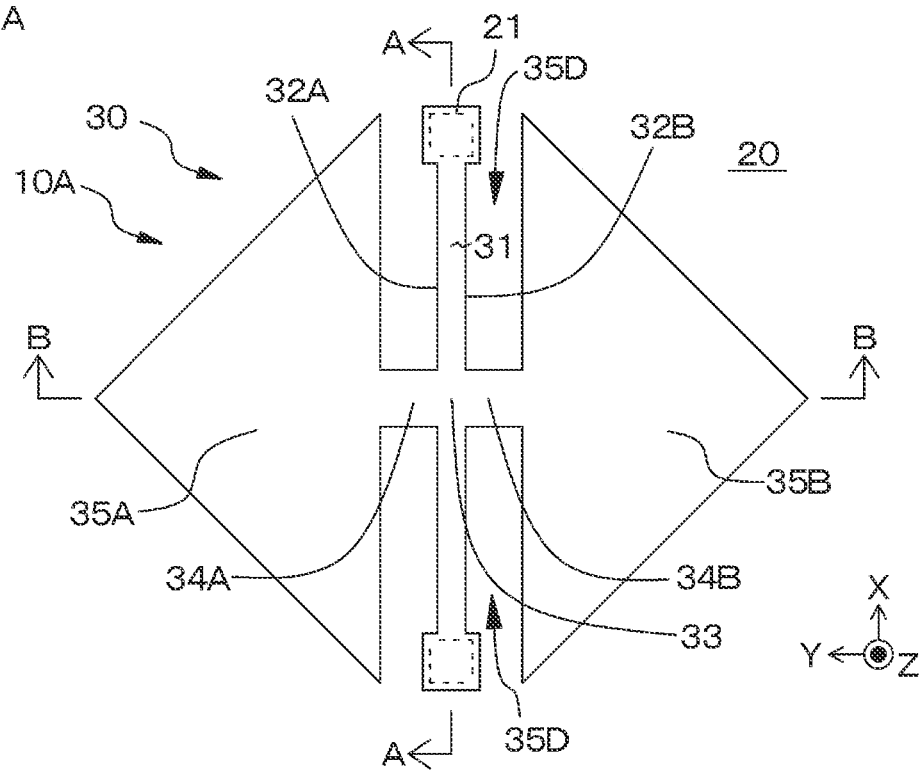
FIGS. 1A and 1B are a schematic plan view of a support portion and a hinge portion constituting a light reflecting element of a first embodiment, and a schematic plan view of a lower layer support layer, respectively.
Figure 1:
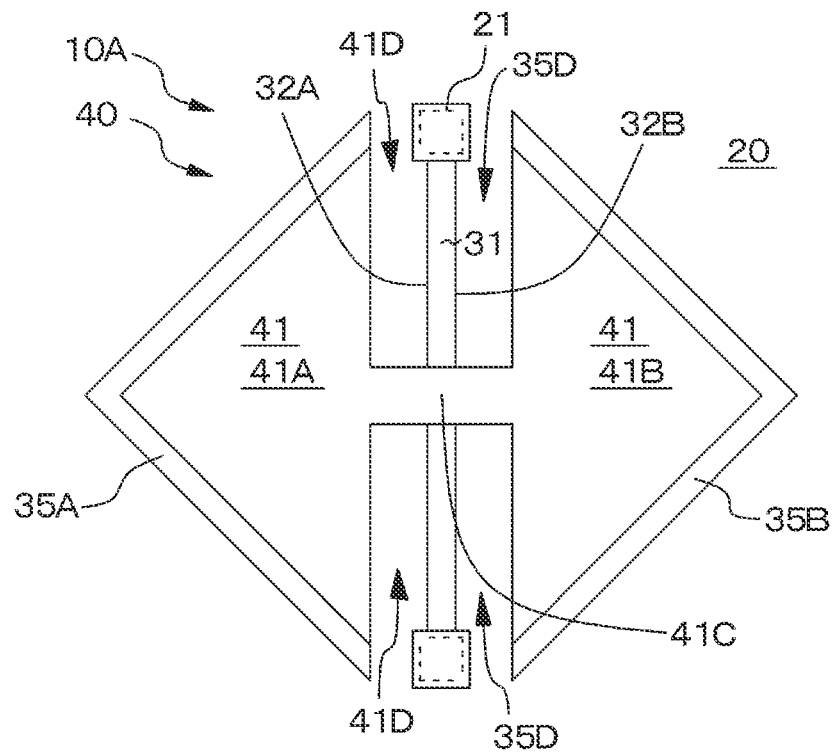

Hereinafter, the present disclosure will be described on the basis of embodiments with reference to the figures, but the present disclosure is not limited to the embodiments, and various numerical values and materials in the embodiments are examples. Further, the description will be given in the following order.

1. Description of overall light reflecting element and spatial light modulator of present disclosure
2. First embodiment (light reflecting element and spatial light modulator of present disclosure)
3. Second embodiment (modification of first embodiment)
4. Third embodiment (other modification of first embodiment)
5. Other <Description of Overall Light Reflecting Element and Spatial Light Modulator of Present Disclosure>

In the light reflecting element of the present disclosure and the light reflecting elements provided in the spatial light modulator of the present disclosure (hereinafter, these light reflecting elements are collectively referred to as the "light reflecting element or the like of the present disclosure"), the recessed portion is provided at least at the portion of the support layer facing the space located between the first movable piece and the second movable piece (in other words, it is provided in a region sandwiched between a portion (an edge portion) of the first movable piece and a portion (an edge portion) of the second movable piece that face each other), but the recessed portion (a kind of cavity) may be provided at a portion of the support layer facing a space partitioned by the first movable piece, the first extending portion, the second extending portion, and the second movable piece, and in addition to this recessed portion, a second recessed portion (a kind of cavity) communicating with the recessed portion provided between the first movable piece and the second movable piece may be provided at a portion above the first movable piece, the first extending portion, the second extending portion, and the second movable piece. Also, the former is referred to as "the light reflecting element or the like of the present disclosure of a first aspect" for convenience, and the latter is referred to as "the light reflecting element or the like of the present disclosure of a second aspect" for convenience.

The light reflecting element or the like of the present disclosure of the first aspect may have a configuration in which the support layer has a two-layer structure of a lower layer support layer and an upper layer support layer, the lower layer support layer is configured of a first lower layer support layer, a second lower layer support layer, and a third lower layer support layer, the first lower layer support layer is formed on the first movable piece, the second lower layer support layer is formed on the second movable piece, the third lower layer support layer is formed on the first extending portion, on the second extending portion, and on a portion of the torsion bar portion located between the first extending portion and the second extending portion, and the upper layer support layer is formed to extend from above the first lower layer support layer to above the second lower layer support layer including an above portion of the third lower layer support layer. Also, the light reflecting element or the like of the present disclosure having such a configuration is referred to as a "light reflecting element having a first configuration" for convenience.

The light reflecting element of the first configuration may have a configuration in which the upper layer support layer is formed on the first lower layer support layer, the third lower layer support layer, and the second lower layer support layer, and above a space (a recessed portion) surrounded by the first lower layer support layer, the second lower layer support layer, and the third lower layer support layer.

Alternatively, the light reflecting element or the like of the present disclosure of the first aspect may have a configuration in which the support layer has the two-layer structure of the lower layer support layer and the upper layer support layer,
the lower layer support layer is configured of a first A lower layer support layer, a first B lower layer support layer, a first C lower layer support layer, a second A lower layer support layer, a second B lower layer support layer, a second C lower layer support layer, and a third lower layer support layer,
the first A lower layer support layer is formed on the first movable piece,
the first B lower layer support layer and the first C lower layer support layer are separated from a side portion of the first A lower layer support layer and formed on the first movable piece with the first A lower layer support layer interposed therebetween,
the second A lower layer support layer is formed on the second movable piece,
the second B lower layer support layer and the second C lower layer support layer are separated from a side portion of the second A lower layer support layer and formed on the second movable piece with the second A lower layer support layer interposed therebetween,
the first extending portion, the second extending portion, and a portion of the torsion bar portion located between the first extending portion and the second extending portion are located between the first A lower layer support layer and the second A lower layer support layer, the third lower layer support layer is formed on the first extending portion, on the second extending portion, and on the portion of the torsion bar portion located between the first extending portion and the second extending portion, and the upper layer support layer is formed to extend from above the first lower layer support layer to above the second lower layer support layer including an above portion of the third lower layer support layer. Also, the light reflecting element or the like of the present disclosure having such a configuration is referred to as a "light reflecting element having a second configuration" for convenience.

The light reflecting element having the second configuration may have a configuration in which the upper layer support layer is formed on the third lower layer support layer, formed to extend from the first B lower layer support layer to the first C lower layer support layer, formed to extend from the second B lower layer support layer to the second C lower layer support layer, formed above a space (a recessed portion) surrounded by the first B lower layer support layer, the second B lower layer support layer, and the third lower layer support layer, and formed above a space (a recessed portion) surrounded by the first C lower layer support layer, the second C lower layer support layer, and the third lower layer support layer.

The light reflecting element or the like of the present disclosure including various preferred configurations described above may have a form in which the recessed portion is provided on a surface of the support layer on a base body side (a surface opposite to a surface on which a light reflecting layer is provided).

Further, the light reflecting element or the like of the present disclosure including various preferred configurations described above may have a form in which both ends of the torsion bar portion are fixed to the support portion, or may have a form in which one end of the torsion bar portion is fixed to the support portion.

Further, the light reflecting element or the like of the present disclosure including the above-mentioned preferred configurations and forms may have a form in which, the first extending portion and the second extending portion are disposed line-symmetrically with an axis of the torsion bar portion as an axis of symmetry, and the first movable piece and the second movable piece are disposed line-symmetrically with the axis of the torsion bar portion as an axis of symmetry.

Further, the light reflecting element or the like of the present disclosure including various preferred configurations and forms described above may have a form in which the light reflecting portion covers the support portion, and thus an area of the light reflecting layer can be increased and a fill factor of the light reflecting layer can be increased.

Further, the light reflecting element or the like of the present disclosure including various preferred configurations and forms described above may have a form in which electrodes for twistedly deforming the hinge portion around the axis of the torsion bar portion are provided on portions of the base body facing each of the first movable piece and the second movable piece. That is, in a case in which the light reflecting element is driven due to the twisted deformation of the hinge portion, the electrodes (drive electrodes) are provided on the portions of the base body located below the first movable piece and the second movable piece and a voltage is applied to the hinge portion and the drive electrodes, and thus due to an electrostatic force generated between the hinge portion (specifically, the first movable piece and the second movable piece) and the drive electrodes, the hinge portion may be driven (rotated), the torsion bar portion may be twisted, or tips of the movable pieces may be driven (moved up and down). The voltage is applied to the drive electrodes, for example, from a drive circuit provided on the base body, and the voltage is also applied to the hinge portion, for example, from the drive circuit provided on the base body.

Further, the light reflecting element or the like of the present disclosure including various preferred forms and configurations described above may have a form in which a stopper is provided in a region of the base body located below the tips of the movable pieces. An insulating layer may be formed on a surface of the stopper, an antistatic layer may be formed to prevent charge, or an adhesion prevention layer may be formed so that the stopper and the movable pieces do not come into close contact with each other when the stopper and the movable pieces come into contact with each other.

The base body can be configured of, for example, a silicon substrate, or can be configured of a silicon on insulator (SOI). A lower end portion of the support portion is fixed to the base body, but specifically, for example, the support portion may be formed on the base body.

The support portion is basically configured of a rigid body that does not expand or contract, and more specifically, can be configured of, for example, silicon, amorphous silicon, silicon oxide, a combination of silicon and silicon oxide, SiN, and SiON. A cross-sectional shape of the support portion when the support portion is cut along a virtual plane perpendicular to an axis of the support portion can be essentially any shape such as a circle, an ellipse, an oval, a quadrangle such as a square, a rectangle, or a trapezoid, and the like. As described above, the number of support portions is 2 or 1.

The hinge portion can be configured of, for example, a silicon layer, a silicon oxide layer, a laminated structure of a silicon layer and a silicon oxide layer, SiN, SiON, TiN, TiAl, AlN, TiSiN, or TiAlN. The support layer can also be configured of, for example, a silicon layer, an amorphous silicon layer, a silicon oxide layer, or a laminated structure of a silicon layer and a silicon oxide layer.

The torsion bar portion is fixed to a back surface of an upper end portion of the support portion, but specifically, the torsion bar portion may be formed on the upper end portion of the support portion. Alternatively, the support portion and the torsion bar portion may be bonded using, for example, a well-known bonding technique. Here, as the bonding technique, not only a method of using an epoxy adhesive, an organic material such as benzo-cyclobutene (BCB) and CYTOP, a glass frit, water glass, or the like as an adhesive layer, but also a method of using a solder layer or the like as an adhesive layer, an anode bonding method, a wafer direct bonding method including a method of treating a wafer surface with plasma such as oxygen, and a surface activation room temperature bonding method can also be exemplified.

The light reflecting layer constituting the light reflecting portion can be configured of a metal film or an alloy film formed on a surface (a front surface) of the support layer that is a light incidence side, and can be formed using, for example, various physical vapor deposition methods (PVD methods) or various chemical vapor deposition methods (CVD methods). Specific examples of materials constituting the light reflecting layer include gold (Au), silver (Au), aluminum (Al), or alloys thereof.

An outer shape of the support layer can be essentially any shape such as a circle, an ellipse, an oval (a shape in which a semicircle and two line segments are combined), or a quadrangle such as a square, a rectangle, or a trapezoid. In addition, an outer shape of the light reflecting layer can also be essentially any shape such as a circle, an ellipse, an oval, or a quadrangle such as a square, a rectangle, or a trapezoid. The support layer and the light reflecting layer may have the same or a similar or analogous outer shape, or may have different outer shapes. Further, the support layer and the light reflecting layer may have the same size, the support layer may be larger than the light reflecting layer, or the light reflecting layer may be larger than the support layer.

Light is incident on the light reflecting layer of the spatial light modulator from the outside, and the light is emitted from the light reflecting layer to the outside. By driving the hinge portion, an emission direction of the light from the light reflecting layer to the outside can be controlled, and as a result, for example, an image can be displayed on an external screen, a display unit, or a display device, which can be applied to, for example, a projection type display device (projector), a head-mounted display (HMD), a spectroscopic device, or an exposure device. The spatial light modulator can control on and off of the incident light. Here, the on-control indicates a state in which incident light is emitted in a desired direction in order to display an image, and the off-control indicates a state in which incident light is emitted in another desired direction not to display an image.

First Embodiment

Figure 2:
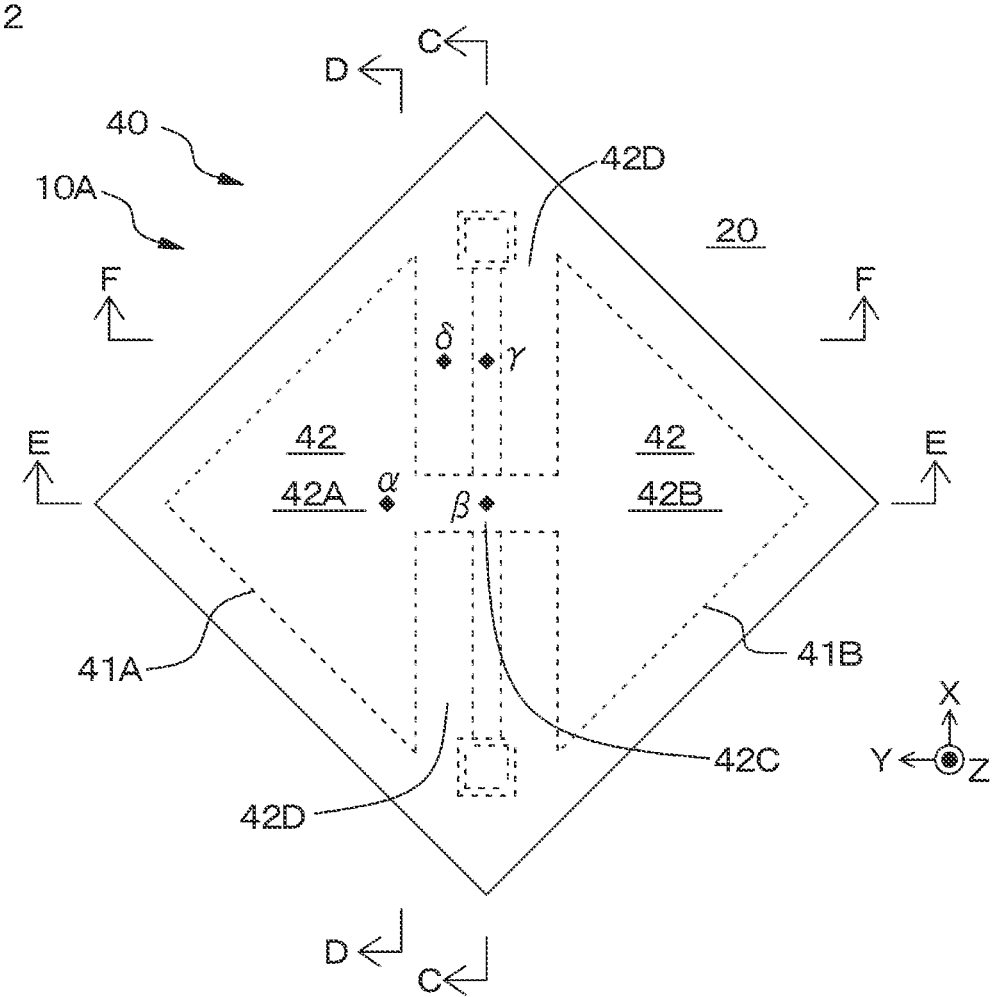
FIG. 2 is a schematic plan view of an upper layer support layer constituting the light reflecting element of the first embodiment.
Figure 3:
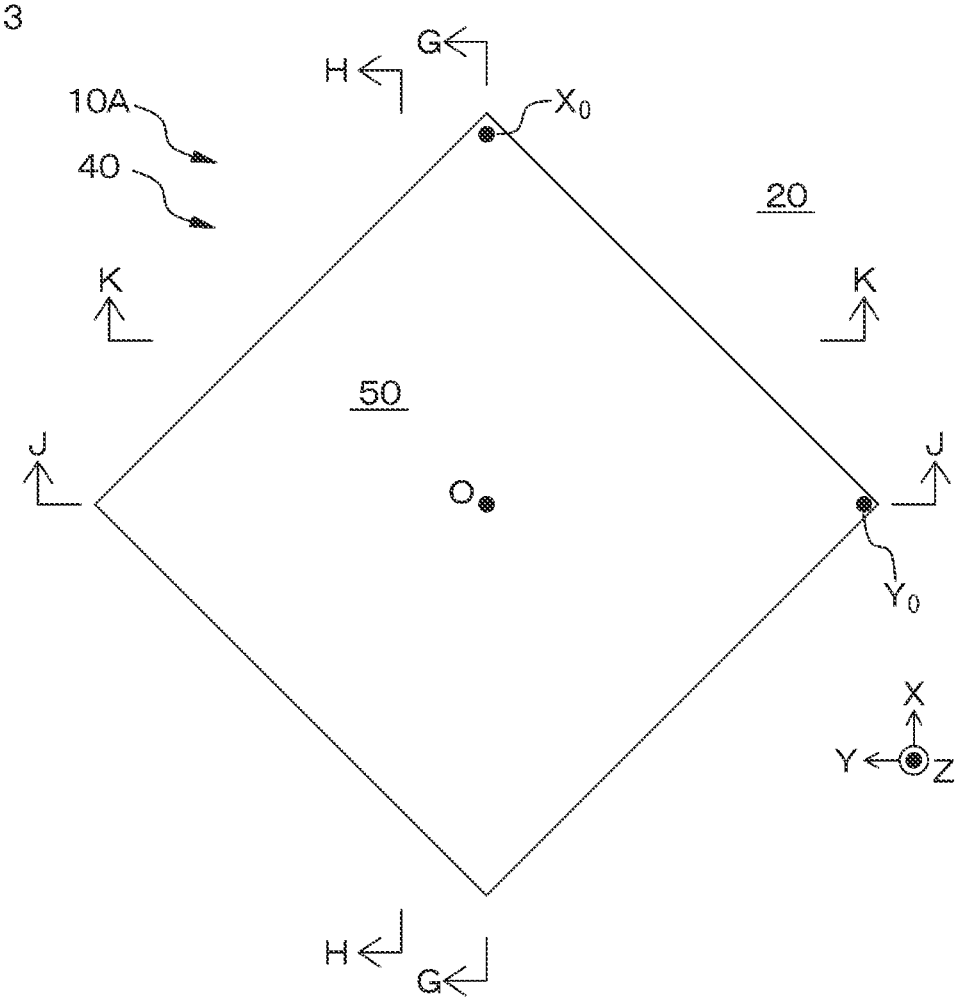
FIG. 3 is a schematic plan view of a light reflecting layer constituting the light reflecting element of the first embodiment.
Figure 4:
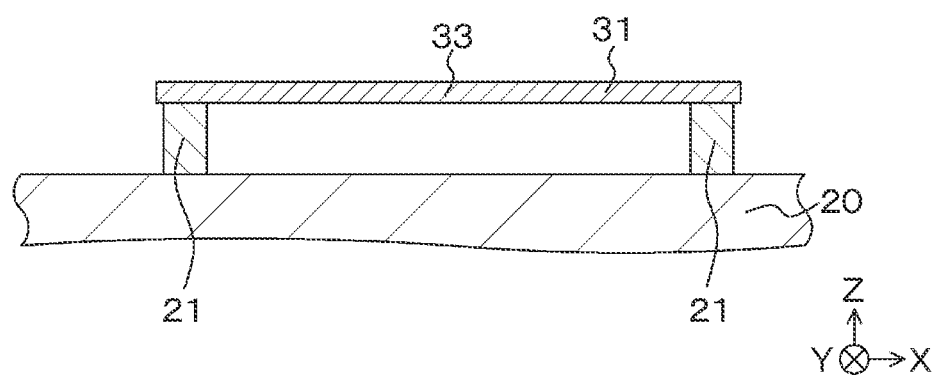
FIGS. 4A and 4B are a schematic cross-sectional view along arrow A-A in FIG. 1A and a schematic cross-sectional view along arrow B-B in FIG. 1A, respectively.
Figure 4:
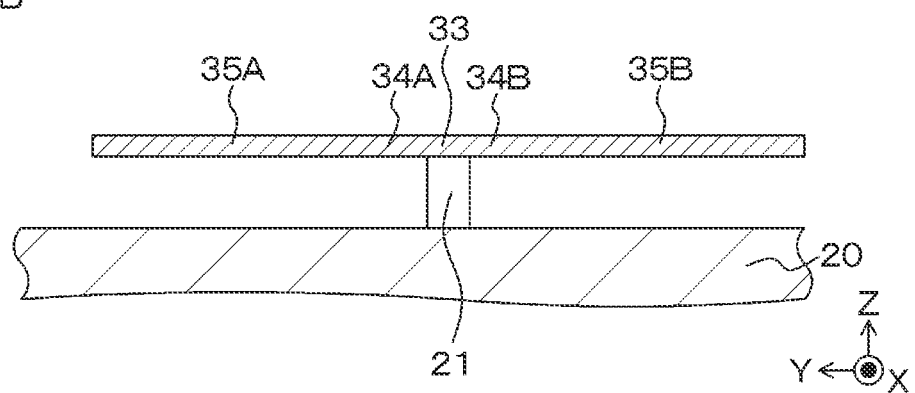
Figure 5:
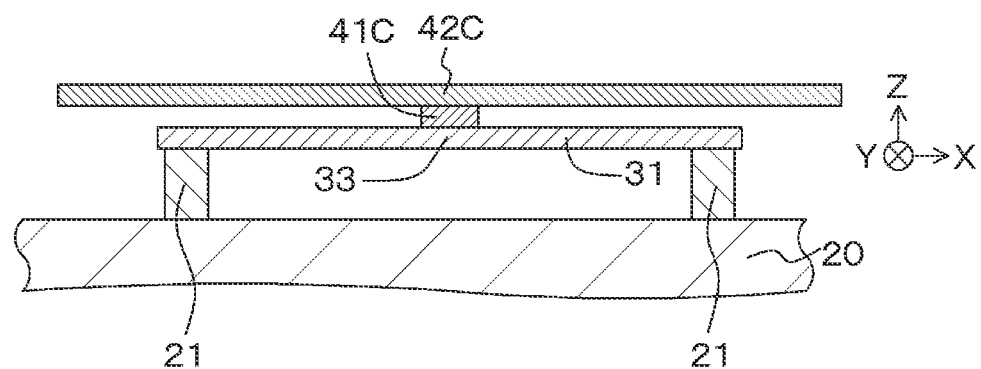
FIGS. 5A and 5B are a schematic end view along arrow C-C of FIG. 2 and a schematic cross-sectional view along arrow D-D in FIG. 2, respectively.
Figure 5:
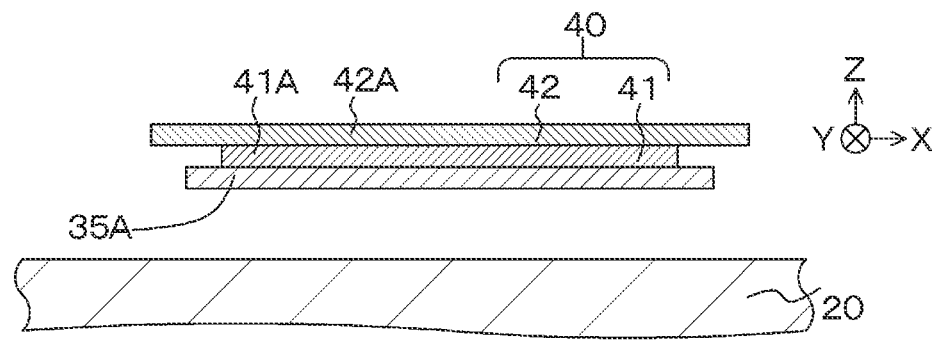
Figure 6:
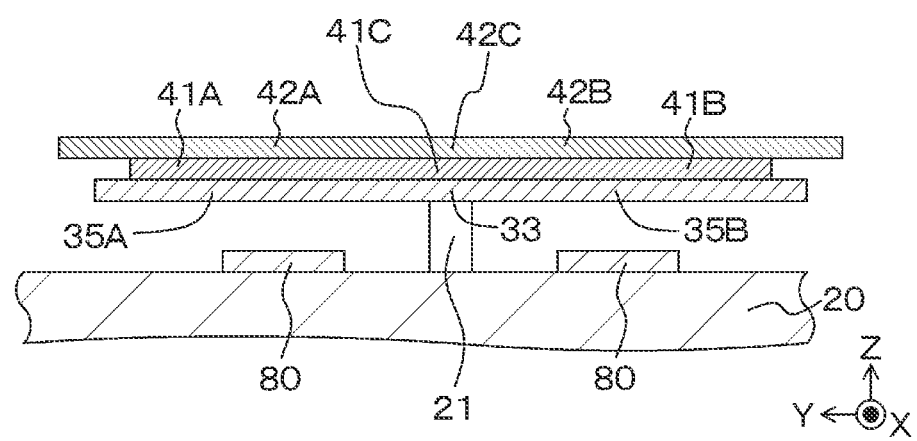
FIGS. 6A and 6B are a schematic cross-sectional view along arrow E-E in FIG. 2 and a schematic cross-sectional view along arrow F-F in FIG. 2, respectively.
Figure 6:
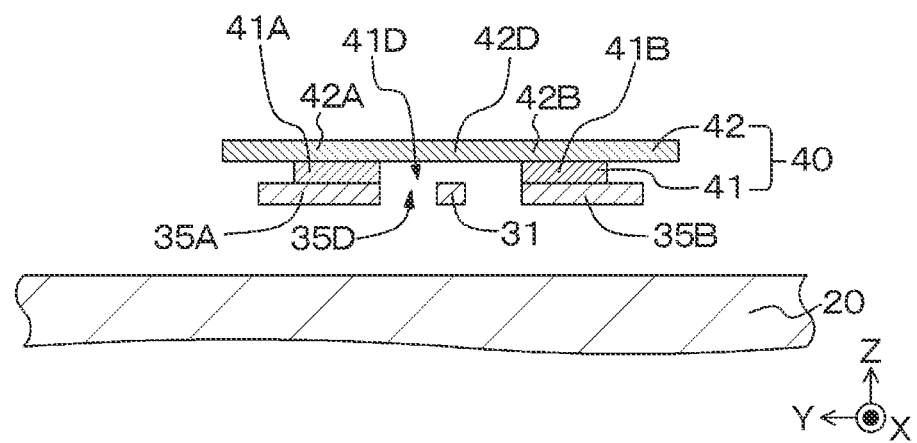
Figure 7:
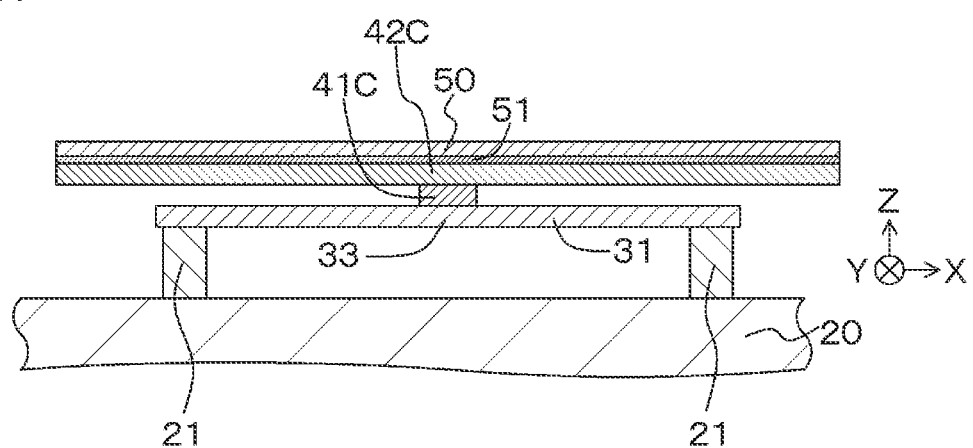
FIGS. 7A and 7B are a schematic end view along arrow G-G in FIG. 3 and a schematic cross-sectional view along arrow H-H in FIG. 3, respectively.
Figure 7:
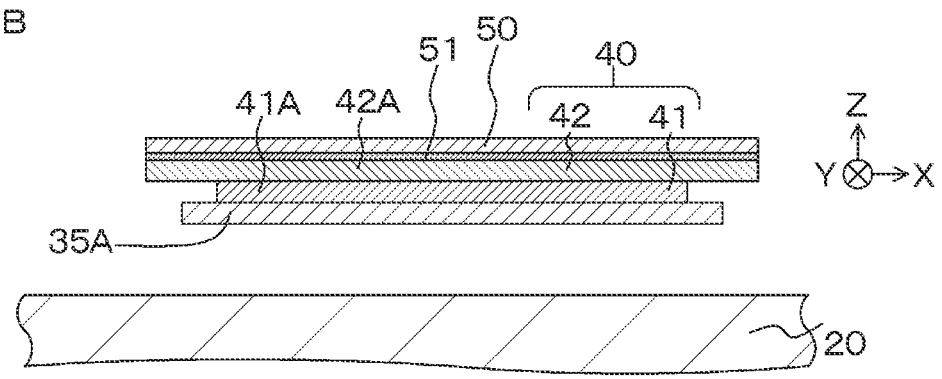
Figure 8:
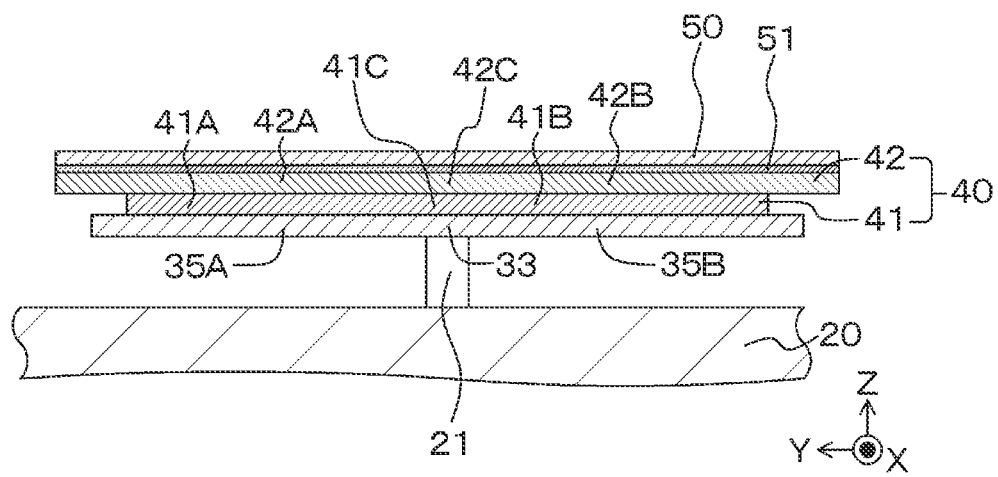
FIGS. 8A and 8B are a schematic end view along arrow J-J in FIG. 3 and a schematic cross-sectional view along arrow K-K in FIG. 3, respectively.
Figure 8:
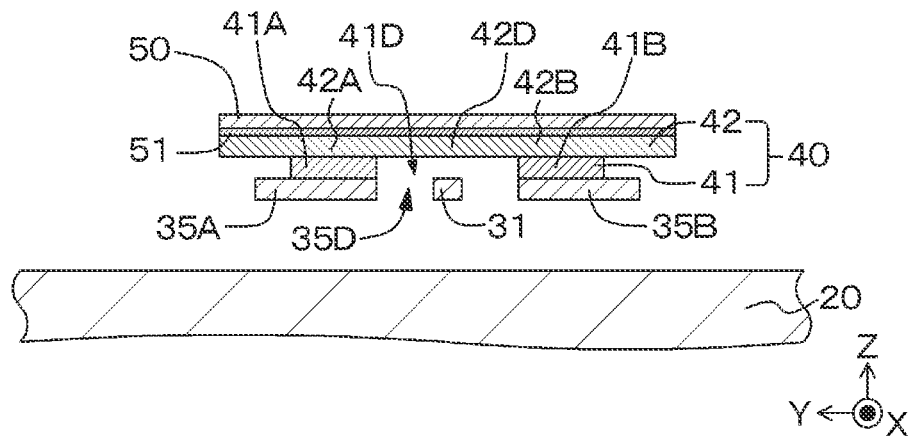

A first embodiment relates to the light reflecting element and the spatial light modulator of the present disclosure, and specifically, the light reflecting element of the first configuration. FIG. 1A shows a schematic plan view of the support portion and the hinge portion constituting the light reflecting element of the first embodiment, FIG. 1B shows a schematic plan view of the lower layer support layer, FIG. 2 shows a schematic plan view of the upper layer support layer constituting the light reflecting element, and FIG. 3 shows a schematic plan view of the light reflecting layer. Further, FIG. 4A shows a schematic cross-sectional view along arrow A-A in FIG. 1A, FIG. 4B shows a schematic cross-sectional view along arrow B-B in FIG. 1A, FIG. 5A shows a schematic end view along arrow C-C in FIG. 2, FIG. 5B shows a schematic cross-sectional view along arrow D-D in FIG. 2, FIG. 6A shows a schematic cross-sectional view along arrow E-E in FIG. 2, FIG. 6B shows a schematic cross-sectional view along arrow F-F in FIG. 2, FIG. 7A shows a schematic end view along arrow G-G in FIG. 3, FIG. 7B shows a schematic cross-sectional view along arrow H-H in FIG. 3, FIG. 8A shows a schematic cross-sectional view along arrow J-J in FIG. 3, and FIG. 8B shows a schematic cross-sectional view along arrow K-K in FIG. 3. Also, in FIG. 2, illustration of the movable pieces is omitted.

Light reflecting elements 10A, 10B, 10C, and 10D of the first embodiment or second and third embodiments, which will be described later, are the light reflecting elements of the first aspect, each of which is configured of support portions 21 provided on a base body 20, a hinge portion 30, and a light reflecting portion 40, the light reflecting portion 40 is configured of a support layer (a mirror plate) and a light reflecting layer (a mirror portion) 50 formed on the support layer, the hinge portion 30 is configured of a torsion bar portion 31, a first extending portion 34A extending from a portion of one side portion 32A of the torsion bar portion 31, a first movable piece 35A extending from an end portion of the first extending portion 34A, a second extending portion 34B extending from a portion of the other side portion 32B of the torsion bar portion 31, and a second movable piece 35B extending from an end portion of the second extending portion 34B, end portions of the torsion bar portion 31 are fixed to the support portions 21, the hinge portion 30 is twistedly deformable around an axis of the torsion bar portion 31, and the support layer is formed to extend from a portion on the first movable piece 35A to a portion on the second movable piece 35B.

In addition, recessed portions 41D are provided at least at portions of the support layer facing a space 35D located between the first movable piece 35A and the second movable piece 35B. That is, the recessed portions 41D are provided in a region sandwiched between a portion of the first movable piece 35A (an edge portion of the first movable piece 35A facing the torsion bar portion 31) and a portion of the second movable piece 35B (an edge portion of the second movable piece 35B facing the torsion bar portion 31) that face each other. Specifically, in the light reflecting elements 10A, 10B, 10C, and 10D of the first embodiment or the second and third embodiment described later, the recessed portions (a kind of cavities) 41D are provided at the portions of the support layer facing the space 35D partitioned by the first movable piece 35A, the first extending portion 34A, the second extending portion 34B, and the second movable piece 35B.

Figure 20:
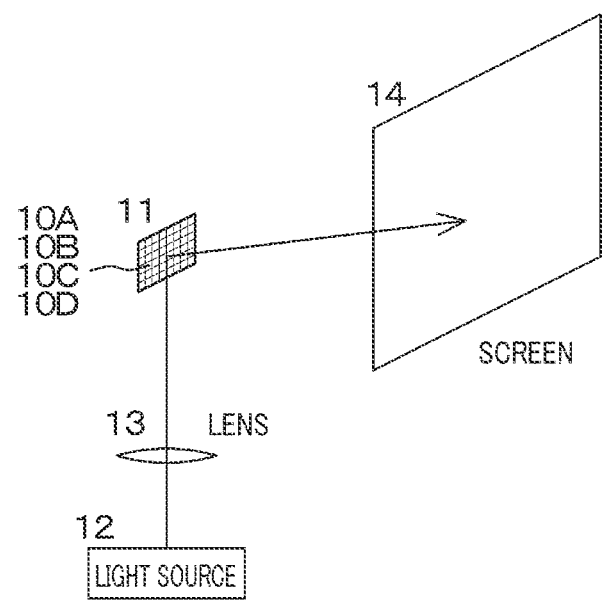
FIG. 20 is a conceptual diagram of a spatial light modulator of the present disclosure.

Further, as a conceptual diagram is shown in FIG. 20, spatial light modulators of the first embodiment or the second and third embodiments described later are spatial light modulators in which light reflecting elements are arranged in an array, and the light reflecting elements are configured of the light reflecting elements 10A, 10B, 10C, and 10D of the first embodiment or the second and third embodiments described later. Light emitted from a light source 12 passes through an optical system (a lens) 13 and is incident on a spatial light modulator 11. Then, the light incident on light reflecting layers 50 of the light reflecting elements 10A, 10B, 10C, and 10D constituting the spatial light modulator 11 is reflected by the light reflecting layers 50 under the control of the light reflecting elements and emitted toward a screen 14 if desired. By driving the hinge portion 30, an emission direction of the light from the light reflecting layer 50 to the screen 14 can be controlled, and as a result, an image can be displayed on the screen 14. On or off control of the incident light can be performed by the spatial light modulator 11.

Here, in the light reflecting elements 10A and 10B of the first embodiment or the second embodiments described later, both ends of the torsion bar portion 31 are fixed to the support portions 21. That is, two support portions 21 are provided.

Further, in the light reflecting elements 10A, 10B, 10C, and 10D of the first embodiment or the second and third embodiments described later, the first extending portion 34A and the second extending portion 34B are disposed line-symmetrically with the axis of the torsion bar portion 31 as an axis of symmetry, and the first movable piece 35A and the second movable piece 35B are disposed line-symmetrically with the axis of the torsion bar portion 31 as an axis of symmetry. In addition, when the hinge portion 30 has not twistedly deformed, the first movable piece 35A and the second movable piece 35B are located parallel to a surface of the base body 20. The light reflecting portion 40 covers the support portion 21.

In addition, in the light reflecting element 10A of the first embodiment, the support layer has a two-layer structure of a lower layer support layer (a lower mirror plate) 41 and an upper layer support layer (an upper mirror plate) 42, the lower layer support layer 41 is configured of a first lower layer support layer 41A, a second lower layer support layer 41B, and a third lower layer support layer 41C, the first lower layer support layer 41A is formed on the first movable piece 35A, the second lower layer support layer 41B is formed on the second movable piece 35B, the third lower layer support layer 41C is formed on the first extending portion 34A, on the second extending portion 34B, and on a portion 33 of the torsion bar portion 31 located between the first extending portion 34A and the second extending portion 34B, and the upper layer support layer 42 is formed to extend from above the first lower layer support layer 41A to above the second lower layer support layer 41B including an above portion of the third lower layer support layer 41C.

Specifically, as shown in FIG. 2, the upper layer support layer 42 is formed on the first lower layer support layer 41A, the third lower layer support layer 41C, and the second lower layer support layer 41B, and above the space (recessed portions 41D) surrounded by the first lower layer support layer 41A, the second lower layer support layer 41B, and the third lower layer support layer 41C. Regions of the upper layer support layer facing each of the first movable piece 35A and the second movable piece 35B, that is, a first upper layer support layer occupying a region above the first movable piece 35A and a second upper layer support layer occupying a region above the second movable piece 35B, are represented by reference numbers 42A and 42B, and a region of the upper layer support layer (a third upper layer support layer) formed from the first upper layer support layer 42A to the second upper layer support layer 42B is represented by reference numeral 42C. Further, a region of the upper layer support layer located above the recessed portions 41D is indicated by reference numeral 42D. The recessed portion 41D is provided on a surface of the support layer on a base body side.

Electrodes 80 for twistedly deforming the hinge portion 30 around the axis of the torsion bar portion 31 are provided on portions of the base body 20 facing each of the first movable piece 35A and the second movable piece 35B. Also, the electrodes 80 are shown only in FIG. 6A. Specifically, the light reflecting elements 10A, 10B, 10C, and 10D are driven due to twisted deformation of the hinge portion 30, but the electrodes (drive electrodes) 80 are provided on the portions of the base body 20 located below the first movable piece 35A and the second movable piece 35B, and a voltage is applied to the hinge portion 30 and the drive electrodes 80, and thus due to an electrostatic force generated between the hinge portion 30 (specifically, the first movable piece 35A and the second movable piece 35B) and the drive electrodes 80, the hinge portion 30 can be driven (rotated), the torsion bar portion 31 can be twisted, or tips of the movable pieces 35A and 35B can be driven (vertically moved).

The base body 20 can be configured of, for example, a silicon substrate. The support portions 21 are made of amorphous silicon (α-Si), the hinge portion 30 is made of TiAlN, the lower layer support layer 41 and the upper layer support layer 42 are made of amorphous silicon (α-Si), and the light reflecting layer 50 is made of aluminum (Al). A base layer 51 made of TiN is formed on a top surface of the upper layer support layer 42. The base layer 51 also functions as a barrier layer against the aluminum layer. A Young's modulus (unit:GPa), a Poisson's ratio, and a linear expansion coefficient (unit:ppm/° C.) of each material are shown in Table 1 below.

TABLE 1

| | Material | Young's modulus | Poisson's ratio | Linear expansion coefficient |
|---|---|---|---|---|
| Light reflecting layer 50 | Al | 85 | 0.3 | 23 |
| Base layer 51 | TiN | 520 | 0.3 | 9.4 |
| Upper layer support layer 42 | α-Si | 138 | 0.3 | 3.6 |
| Lower layer support layer 41 | α-Si | 138 | 0.3 | 3.6 |
| Hinge portion 30 | TiAlN | 209 | 0.3 | 9.5 |
| Support portion 21 | α-Si | 138 | 0.3 | 3.6 |

A light reflecting element of a modification of the first embodiment, which is the light reflecting element of the second aspect, was prototyped, and an amount of warpage thereof was determined. Although the light reflecting element is warped due to a difference in stress generated between constituent materials of the light reflecting element, when a radius of curvature of the warpage is defined as R and a chord length thereof is defined as D assuming that the light reflecting element is warped in an arc shape, the amount of warpage (that is, an arrow height) h can be expressed by:

$$h = R[1 - \{1 - (D/2R)^2\}^{1/2}] = D^2/8R$$

Figure 19:
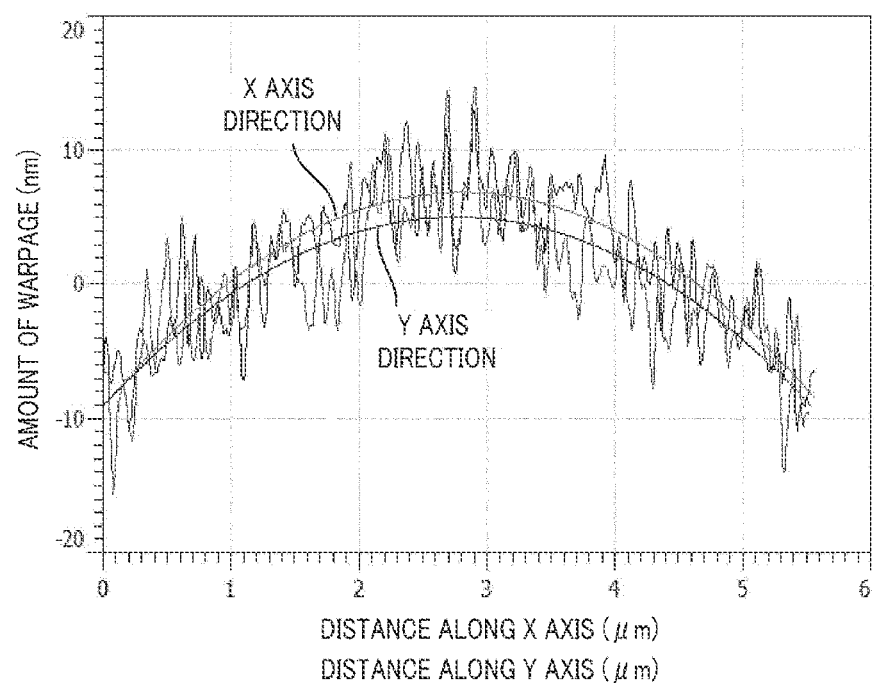
FIG. 19 is a graph showing an amount of warpage obtained in a modification of the first embodiment.

As a result of determining the amount of warpage h of the deformed light reflecting element of the first embodiment at a temperature of 25° C. (room temperature), the amount of warpage h was 15 nm as shown in FIG. 19. Also, a horizontal axis of FIG. 19 indicates a position (unit: μm) along a X axis and a Y axis, which will be described later, a vertical axis shows the amount of warpage (unit:nm), and uneven curves of the amount of warpage along the X axis and the Y axis show profiles, and smooth curves to which these profiles are fitted are also shown.

Figure 17A:
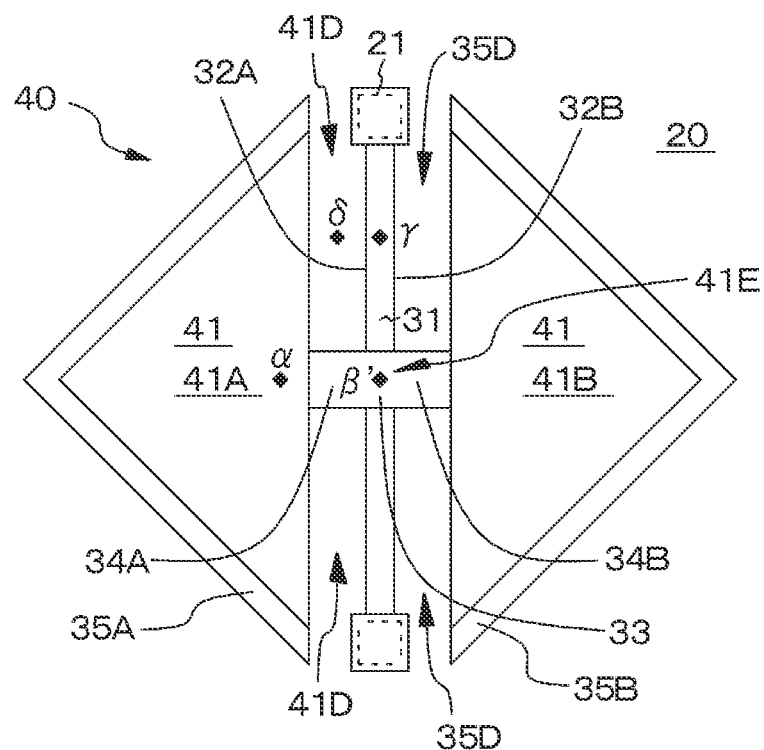
FIGS. 17A and 17B are a schematic plan view of a lower layer support layer constituting a light reflecting element of a modified example of the first embodiment, and a schematic end view of a lower layer support layer and the like constituting the light reflecting element of the modified example of the first embodiment similar to the one along arrow C-C in FIG. 2, respectively.
Figure 17B:
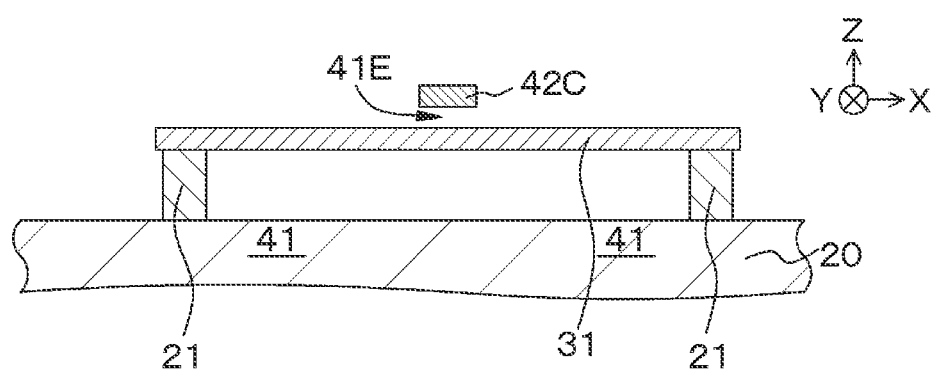

In the light reflecting element of the modification of the first embodiment, the recessed portions 41D are provided at the portions of the support layer facing the space 35D located between the first movable piece 35A and the second movable piece 35B. Specifically, FIG. 17A shows a schematic plan view of the lower layer support layer constituting the light reflecting element of the modification of the first embodiment, and FIG. 17B shows a schematic end view of the lower layer support layer and the like constituting the light reflecting element of a modified example of the first embodiment similar to that along arrow C-C in FIG. 2, but the lower layer support layer 41 is configured of the first lower layer support layer 41A and the second lower layer support layer 41B, and the third lower layer support layer is not formed. That is, in the light reflecting element of the modification of the first embodiment, the support layer has a two-layer structure of the lower layer support layer 41 and the upper layer support layer 42, the lower layer support layer 41 is configured of the first lower layer support layer 41A and the second lower layer support layer 41B, the first lower layer support layer 41A is formed on the first movable piece 35A, the second lower layer support layer 41B is formed on the second movable piece 35B, and the lower layer support layer 41 is not formed to extend above the first extending portion 34A, the second extending portion 34B, and the portion 33 of the torsion bar portion 31 located between the first extending portion 34A and the second extending portion 34B. There is a second recessed portion 41E communicating with the recessed portion 41D above the first extending portion 34A, the second extending portion 34B, and the portion 33 of the torsion bar portion 31. A configuration and a structure of the upper layer support layer 42 are the same as the configuration and the structure of the upper layer support layer 42 of the light reflecting element of the first embodiment. That is, except for the above points, the configuration and the structure of the light reflecting element of the modification of the first embodiment are the same as the configuration and the structure of the light reflecting element of the first embodiment.

The configuration of each layer of the light reflecting element of the first embodiment in an α region, a β region, a γ region, and a δ region shown in FIG. 2, and the configuration of each layer of the modification of the light reflecting element of the first embodiment in an α region, a β region, a γ region, and a δ region shown in FIG. 17A are shown in Table 2 below. In addition, in FIGS. 2 and 17A, these regions are shown by rhombuses painted in black.

TABLE 2

|  | Light reflecting element of first embodiment | Light reflecting element of modification of first embodiment |
|---|---|---|
| (α region) | | |
| Light reflecting layer 50 | Present | Present |
| Base layer 51 | Present | Present |
| Upper layer support layer 42 | Present | Present |
| Lower layer support layer 41 | Present | Present |
| Hinge portion 30 | Present | Present |
| (β region/ β' region) | | |
| Light reflecting layer 50 | Present | Present |
| Base layer 51 | Present | Present |
| Upper layer support layer 42 | Present | Present |
| Lower layer support layer 41 | Present | Absent |
| Hinge portion 30 | Present | Present |
| (γ region) | | |
| Light reflecting layer 50 | Present | Present |
| Base layer 51 | Present | Present |
| Upper layer support layer 42 | Present | Present |
| Lower layer support layer 41 | Absent | Absent |
| Hinge portion 30 | Present | Present |
| (δ region) | | |
| Light reflecting layer 50 | Present | Present |
| Base layer 51 | Present | Present |
| Upper layer support layer 42 | Present | Present |
| Lower layer support layer 41 | Absent | Absent |
| Hinge portion 30 | Absent | Absent |

Figure 21:
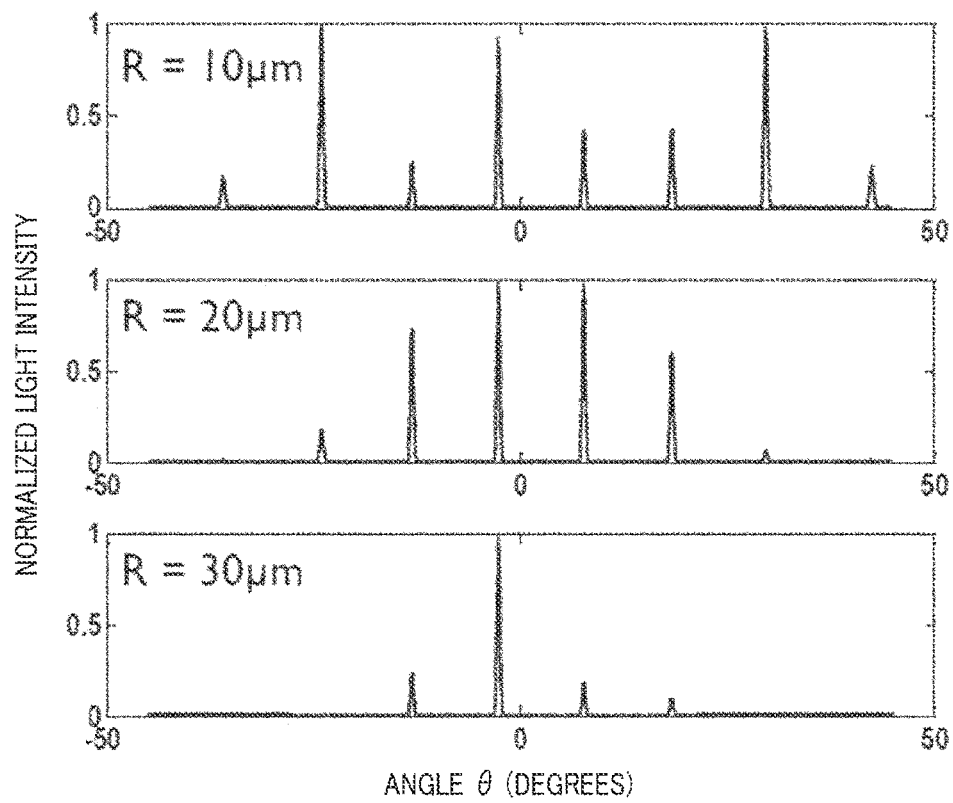
FIG. 21 is a graph showing simulation results of a diffraction phenomenon generated by light from light reflecting elements arranged in an array in a spatial light modulator in which light reflecting elements are arranged in an array.
Figure 22A:
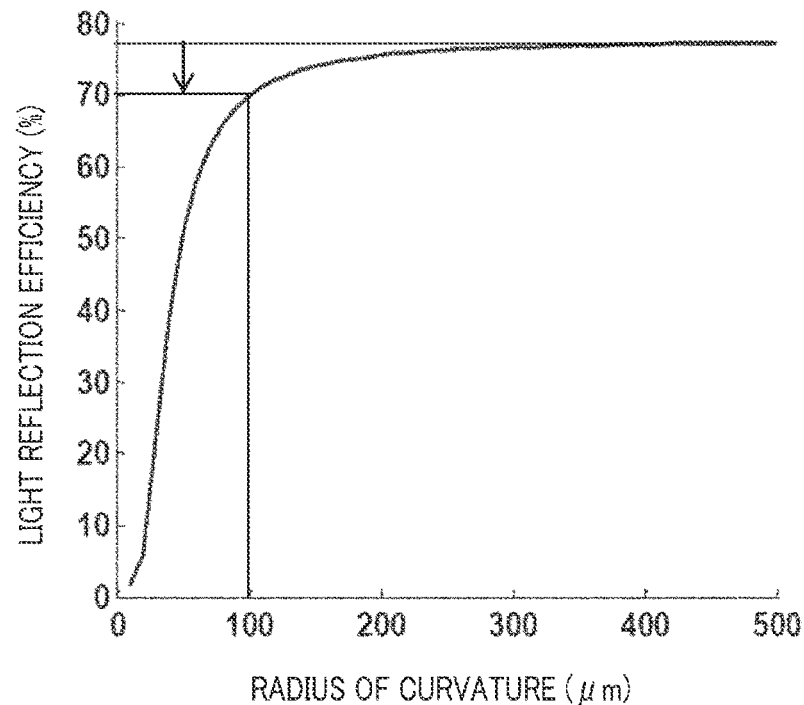
FIGS. 22A and 22B are a graph showing a relationship between a radius of curvature R and light reflection efficiency, and a graph showing a relationship between the radius of curvature R and an amount of warpage h.
Figure 22B:
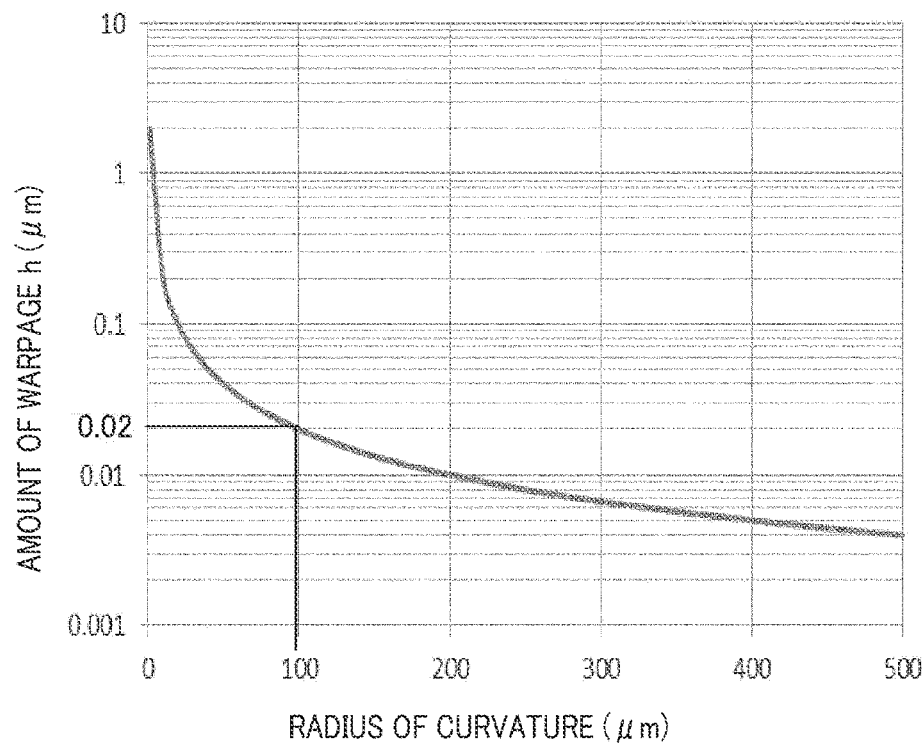

In the spatial light modulator in which the light reflecting elements are arranged in an array, a diffraction phenomenon occurs in the light from the light reflecting elements arranged in an array. FIG. 21 is a diagram showing simulation results of generation of diffracted light when the radius of curvature is R=10 μm, R=20 μm, and R=30 μm. From FIG. 21, as the radius of curvature R becomes smaller, that is, the amount of warpage becomes larger, the diffracted light has a peak in a wider range. As a result, the light reflection efficiency in a predetermined light reflection direction is reduced. From FIGS. 22A and 22B, a value of the radius of curvature R in a case in which the light reflection efficiency is reduced by 10% is 100 μm, which corresponds to the amount of warpage is h=20 nm. In other words, in the spatial light modulator, when the warpage of 20 nm occurs in the light reflecting element, the light reflection efficiency is reduced by 10%.

The amount of warpage of the light reflecting element 10A of the first embodiment, the light reflecting element of the modification of the first embodiment, and the light reflecting element 10B of the second embodiment described later was obtained by simulation. Table 3 below shows results of determining a difference ($\Delta_Y$) between the amount of warpage at 80° C. and the amount of warpage at −20° C. when a temperature is changed from 22° C. to −20° C. and then from −20° C. to 80° C. The amount of warpage is an amount of warpage along the Y axis in FIG. 3 and is an amount of warpage at a point $Y_0$ with respect to a center "O" of the light reflecting layer 50 serving as a reference. At the same time, Table 3 also shows a difference ($\Delta_X$) in an amount of warpage at the center "O" of the light reflecting layer 50 with respect to a point $X_0$ serving as a reference, which is an amount of warpage along the X axis in FIG. 3. The X axis is a straight line that connects centers of the two support portions 21 and passes through the center "O" of the light reflecting layer 50, the Y axis is a straight line that passes through the center "O" of the light reflecting layer 50, is orthogonal to the X axis, and is parallel to the surface of the base body 20, and the Z axis is a straight line that passes through the center "O" of the light reflecting layer 50 and is orthogonal to the X axis and the Y axis.

TABLE 3

|  | $\Delta_Y$ (nm) | $\Delta_X$ (nm) |
|---|---|---|
| First embodiment | 9.16 | |
| Second embodiment | 8.95 | 8.62 |
| Modification of first embodiment | 11.6 | 9.15 |

Although the amount of warpage is smaller in the first and second embodiments than in the modification of the first embodiment, it is considered that this is because the lower layer support layer is not divided into two unlike the modification of the first embodiment, and thus higher rigidity can be imparted to the entire light reflecting element. Further, although the amount of warpage in the second embodiment is smaller than that in the first embodiment, it is considered that this is because, as will be described later, a gap 76A is in a region between a first B lower layer support layer 78A and a side portion of a first A lower layer support layer 77A, a gap 76A' is in a region between a first C lower layer support layer 79A and a side portion of the first A lower layer support layer 77A, a gap 76B is in a region between a second B lower layer support layer 78B and a side portion of a second A lower layer support layer 77B, and a gap 76B' is in a region between a second C lower layer support layer 79B and a side portion of the second A lower layer support layer 77B, and thus generated stress is relaxed.

In the case of using the various materials shown in Table 1, in a laminated structure (referred to as an "upper laminated structure" for convenience) of the light reflecting layer 50 and the upper layer support layer 42 and a laminated structure (referred to as a "lower laminated structure" for convenience) of the lower layer support layer 41 and the hinge portion 30, a model in which one end is supported by the support portion and the other end (tip) is free is assumed. In such a model, in a case in which a temperature is applied to the upper laminated structure and the lower laminated structure, a reversely oriented warpage occurs. Specifically, the upper laminated structure warps convexly downward and the lower laminated structure warps convexly upward. As a result, it is possible to reduce the warpage when the temperature is applied to the light reflecting element having a laminated structure of the upper laminated structure and the lower laminated structure. Specifically, an amount of warpage at the other end of each of the lower laminated structure constituting the light reflecting element of the first embodiment, the lower laminated structure constituting the light reflecting element of the second embodiment described later, and the lower laminated structure constituting the light reflecting element of the modification of the first embodiment depending on a temperature was obtained by simulation. This amount of warpage at the other end is an amount of warpage at the other end (a tip) of the lower laminated structure with respect to the support portion serving as a reference in the model in which one end of the lower laminated structure is supported by the support portion. More specifically, when the temperature is changed from 22° C. to −20° C. and then from −20° C. to 80° C., a difference ($\Delta_X'$) between an amount of warpage of the other end along the X axis at 80° C. and an amount of warpage of the other end along the X axis at −20° C., and a difference ($\Delta_Y'$) between an amount of warpage of the other end along the Y axis at 80° C. and an amount of warpage of the other end along the Y axis at −20° C. were obtained. The results are shown in Table 4 below.

TABLE 4

|  | $\Delta_X'$ (nm) | $\Delta_Y'$ (nm) |
|---|---|---|
| First embodiment | 3.09 | 5.27 |
| Second embodiment | 2.43 | 4.87 |
| Modification of first embodiment | 6.60 | 5.15 |

From the simulation results, it can be seen that, in particular, the warpage along the X axis is improved in the first and second embodiments as compared with the modification of the first embodiment.

As described above, in the light reflecting element of the present disclosure, the support layer is formed to extend from above the first movable piece to above the second movable piece, the recessed portion is provided at least at the portion of the support layer facing the space located between the first movable piece and the second movable piece, and thus the tips of the movable pieces can be easily driven (moved up and down), and reduction in weight of a movable portion can be achieved. On the other hand, high rigidity can be imparted to the light reflecting element, and as a result, it is possible to provide the light reflecting element in which warpage is unlikely to occur and the spatial light modulator having a plurality of such light reflecting elements. Therefore, an improvement in light reflection efficiency during on-control and a reduction of stray light during off-control can be achieved, and as a result, an improvement in contrast ratio can be achieved. In addition, since the support layer having a two-layer structure is formed to extend from above the first extending portion to above the second extending portion, it is possible to impart higher rigidity to the light reflecting element. Further, since the support portion is provided below the light reflecting layer, it is possible to achieve an increase in the area of the light reflecting layer and an increase in the fill factor of the light reflecting layer.

Second Embodiment

Figure 9:
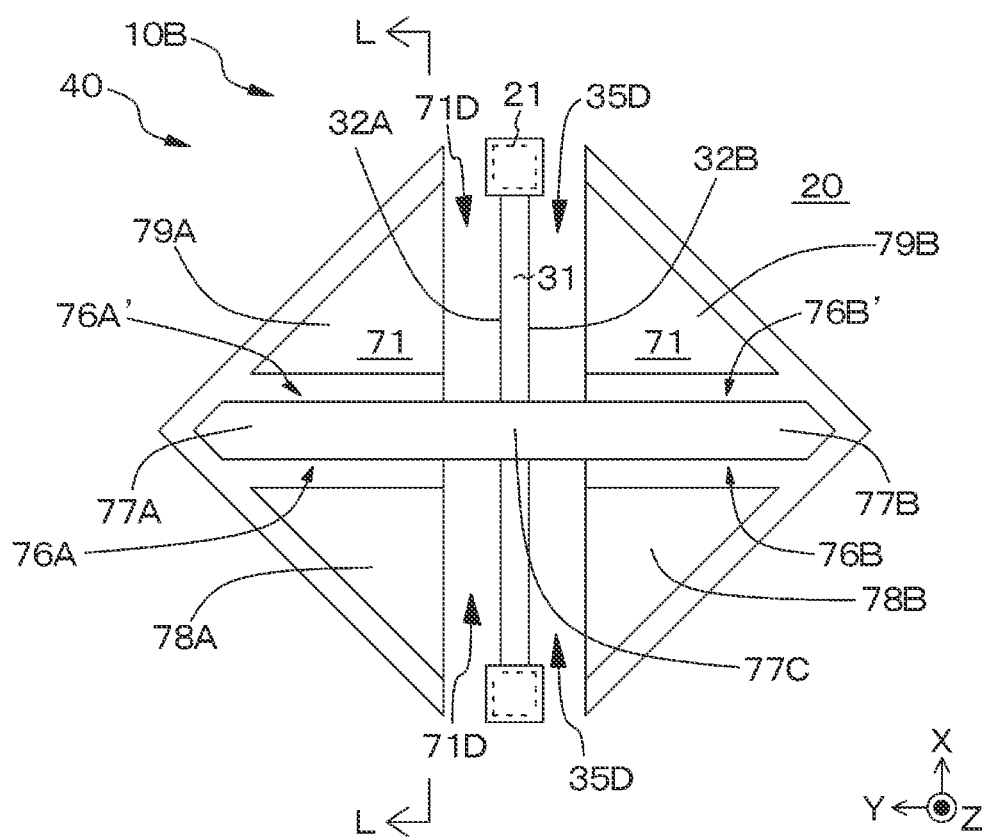
FIG. 9 is a schematic plan view of a lower layer support layer constituting the light reflecting element of a second embodiment.
Figure 10:
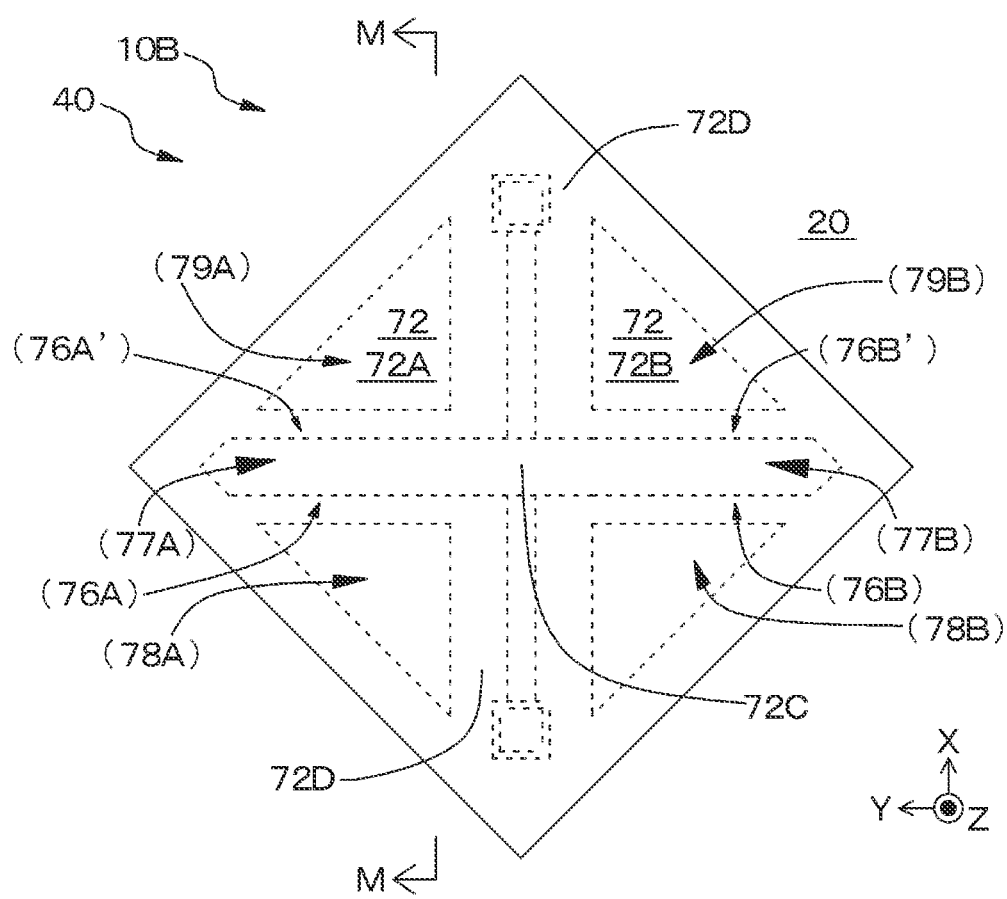
FIG. 10 is a schematic plan view of an upper layer support layer constituting the light reflecting element of the second embodiment.
Figure 11A:
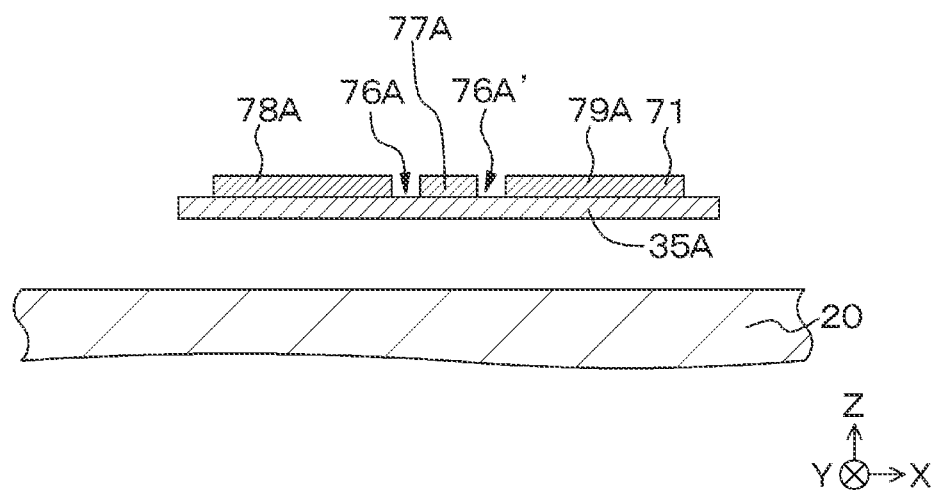
FIGS. 11A and 11B are a schematic cross-sectional view along arrow L-L in FIG. 9 and a schematic cross-sectional view along arrow M-M in FIG. 10, respectively.
Figure 11B:
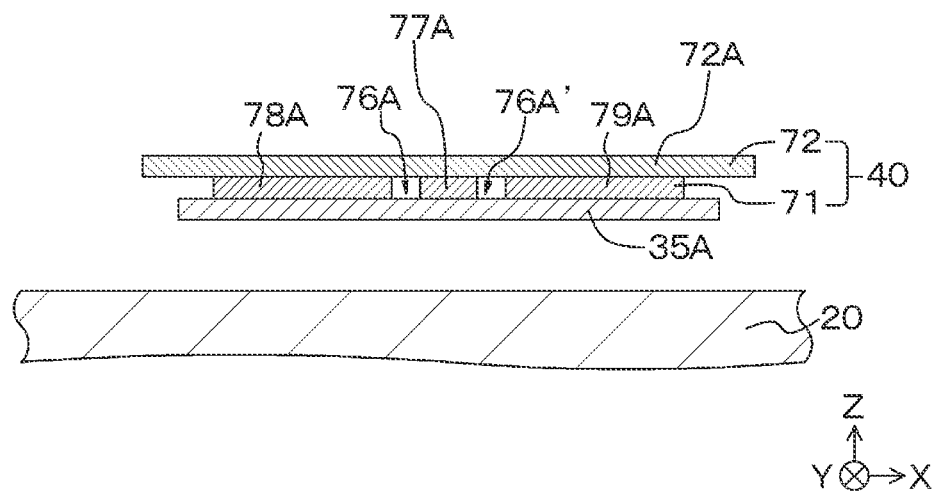

The second embodiment is a modification of the first embodiment and relates to the light reflecting element having the second configuration. FIG. 9 shows a schematic plan view of a lower layer support layer constituting the light reflecting element of the second embodiment, FIG. 10 shows a schematic plan view of an upper layer support layer, FIG. 11A shows a schematic end view along arrow L-L in FIG. 9, and FIG. 11B shows a schematic cross-sectional view along arrow M-M in FIG. 10. The schematic plan view of the support portion and the hinge portion constituting the light reflecting element is the same as that in FIG. 1A. Also, in FIG. 10, the movable pieces are not shown.

In the light reflecting element 10B of the second embodiment,
the support layer has a two-layer structure of a lower layer support layer 71 and an upper layer support layer 72,
the lower layer support layer 71 is configured of the first A lower layer support layer 77A, the first B lower layer support layer 78A, the first C lower layer support layer 79A, the second A lower layer support layer 77B, the second B lower layer support layer 78B, the second C lower layer support layer 79B, and the third lower layer support layer 77C,
the first A lower layer support layer 77A is formed on the first movable piece 35A, the first B lower layer support layer 78A and the first C lower layer support layer 79A are separated from the side portion of the first A lower layer support layer 77A and formed on the first movable piece 35A with the first A lower layer support layer 77A interposed therebetween,
the second A lower layer support layer 77B is formed on the second movable piece 35B,
the second B lower layer support layer 78B and the second C lower layer support layer 79B are separated from the side portion of the second A lower layer support layer 77B and formed on the second movable piece 35B with the second A lower layer support layer 77B interposed therebetween,
the first extending portion 34A, the second extending portion 34B, and the portion 33 of the torsion bar portion 31 located between the first extending portion 34A and the second extending portion 34B are located between the first A lower layer support layer 77A and the second A lower layer support layer 77B,
the third lower layer support layer 77C is formed on the first extending portion 34A, on the second extending portion 34B, and on the portion 33 of the torsion bar portion 31 located between the first extending portion 34A and the second extending portion 34B, and
the upper layer support layer 72 is formed to extend from above the first lower layer support layer 77A to above the second lower layer support layer 77B including an above portion of the third lower layer support layer 77C.

Specifically, the upper layer support layer 72 is formed on the third lower layer support layer 77C, formed to extend from the first B lower layer support layer 77A to the first C lower layer support layer 78A, formed to extend from the second B lower layer support layer 77B to the second C lower layer support layer 78B, formed above a space (a recessed portion 71D) surrounded by the first B lower layer support layer 78A, the second B lower layer support layer 79A, and the third lower layer support layer 77C, and formed above a space (a recessed portion 71D) surrounded by the first C lower layer support layer 79A, the second C lower layer support layer 79B, and the third lower layer support layer 77C. Regions of the upper layer support layer facing each of the first movable piece 35A and the second movable piece 35B, that is, the first upper layer support layer that occupies a region above the first movable piece 35A, and the second upper layer support layer that occupies a region above the second movable piece 35B are represented by reference numbers 72A and 72B, and a region of the upper layer support layer (third upper layer support layer) formed to extend from the first upper layer support layer 72A to the second upper layer support layer 72B is represented by reference numeral 72C. Further, regions of the upper layer support layer located above the recessed portions 71D are indicated by reference numeral 72D.

The gap 76A is in the region between the first B lower layer support layer 78A and the side portion of the first A lower layer support layer 77A, and the gap 76A' is in the region between the first C lower layer support layer 79A and the side portion of the first A lower layer support layer 77A. The gap 76B is in the region between the second B lower layer support layer 78B and the side portion of the second A lower layer support layer 77B, and the gap 76B' is in the region between the second C lower layer support layer 79B and the side portion of the second A lower layer support layer 77B.

More specifically, as shown in FIG. 10, the upper layer support layer 72 is formed:
 [1] on the first A lower layer support layer 77A;
 [2] on the first B lower layer support layer 78A;
 [3] on the first C lower layer support layer 79A;
 [4] on the second A lower layer support layer 77B;
 [5] on the second B lower layer support layer 78B; and
 [6] on the second C lower layer support layer 79B.

Further, the upper layer support layer 72 is formed to extend:
 [A] from the first A lower layer support layer 77A to the first B lower layer support layer 78A;
 [B] from the first A lower layer support layer 77A to the first C lower layer support layer 79A;
 [C] from the second A lower layer support layer 77B to the second B lower layer support layer 78B;
 [D] from the second A lower layer support layer 77B to the second C lower layer support layer 79B;
 [E] from the first A lower layer support layer 77A to the second A lower layer support layer 77B;
 [F] from the first B lower layer support layer 78A to the second B lower layer support layer 78B;
 [G] from the first C lower layer support layer 79A to the second C lower layer support layer 79B;
 [H] from a region above the gap 76A to a region above the gap 76B; and
 [I] from a region above the gap 76A' to a region above the gap 76B'.

Except for the above points, a configuration and a structure of the light reflecting element of the second embodiment can be the same as the configuration and the structure of the light reflecting element described in the first embodiment, and thus detailed description thereof will be omitted. According to the second embodiment, in addition to the effects described in the first embodiment, since the gaps 76A, 76A', 76B, and 76B' are provided, removal of a sacrificial layer when the light reflecting element is manufactured becomes easier, and thus stabilization of a manufacturing process and improvement of a manufacturing yield can be achieved. Further, since a mass of the support layer can be reduced, an inertial force of the support layer can be reduced, and thus operational responsiveness of the light reflecting element can be improved.

Third Embodiment

Figure 12A:
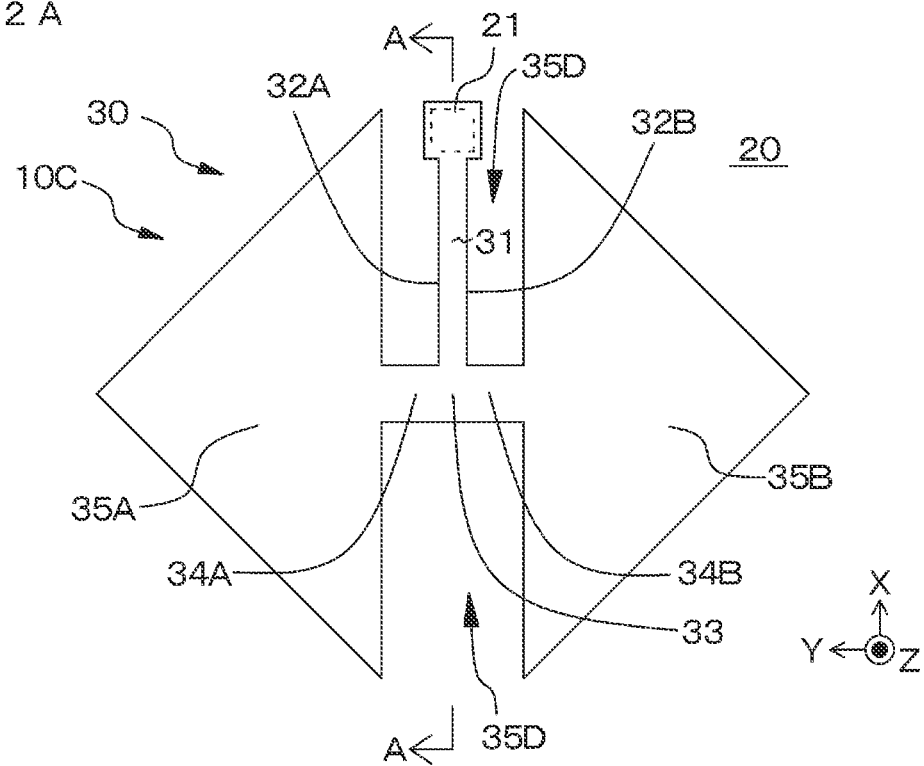
FIGS. 12A and 12B are a schematic plan view of a support portion and a hinge portion constituting a light reflecting element of a third embodiment, and a schematic plan view of a lower layer support layer, respectively.
Figure 12B:
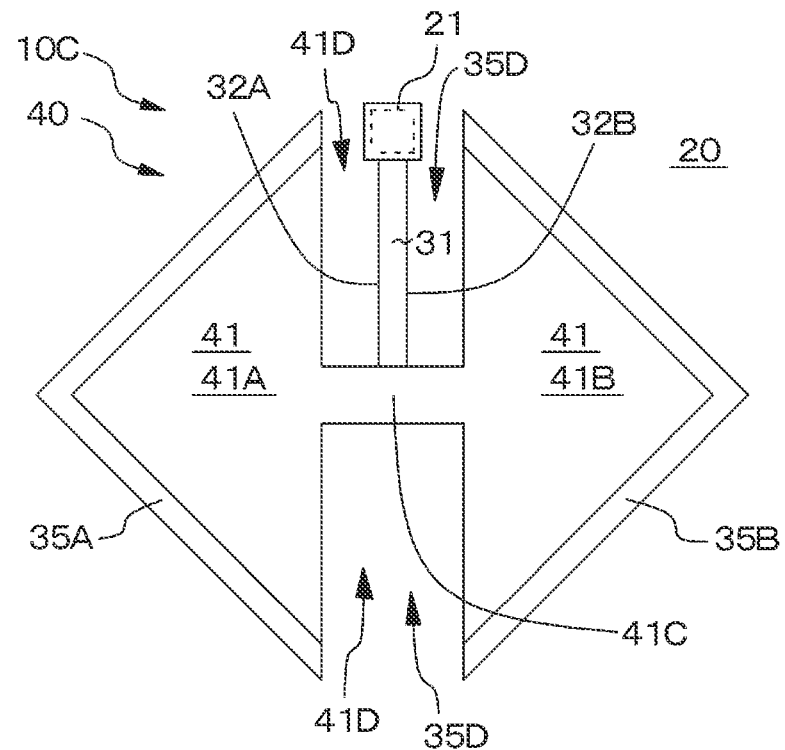
Figure 13:
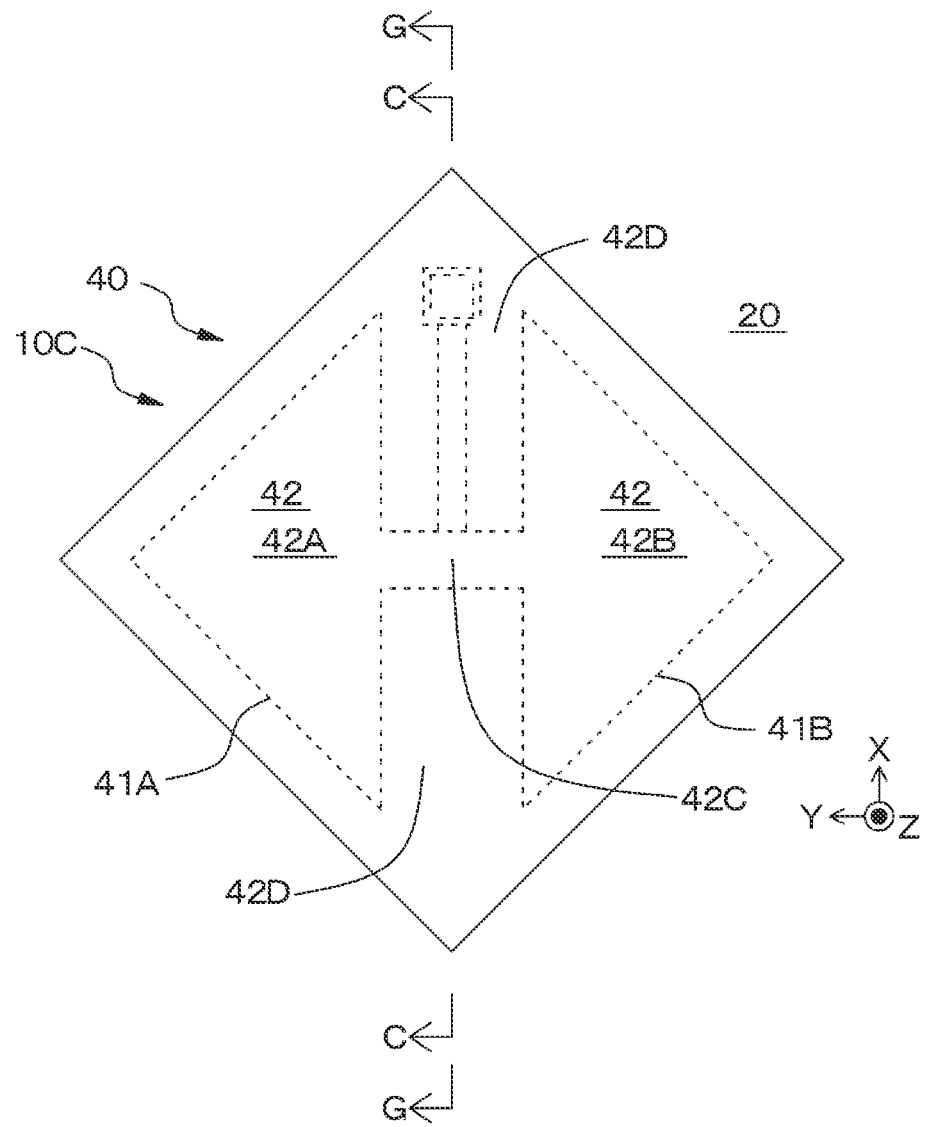
FIG. 13 is a schematic plan view of an upper layer support layer constituting the light reflecting element of the third embodiment.
Figure 14A:
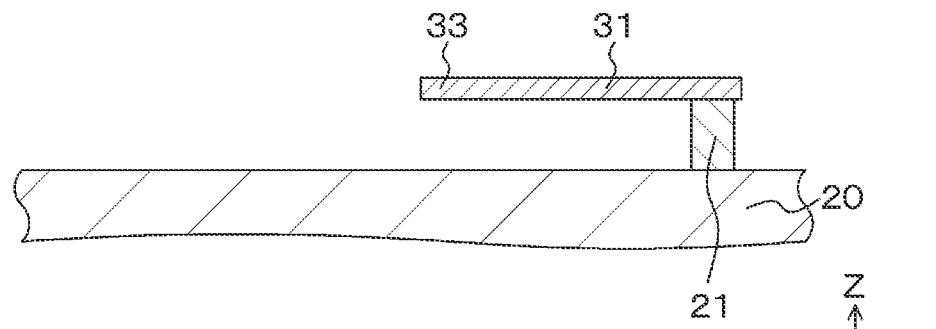
FIGS. 14A, 14B and 14C are a schematic end view along arrow A-A in FIG. 12A, a schematic end view along arrow C-C in FIG. 13, and a schematic end view along arrow G-G in FIG. 13, respectively.
Figure 14B:
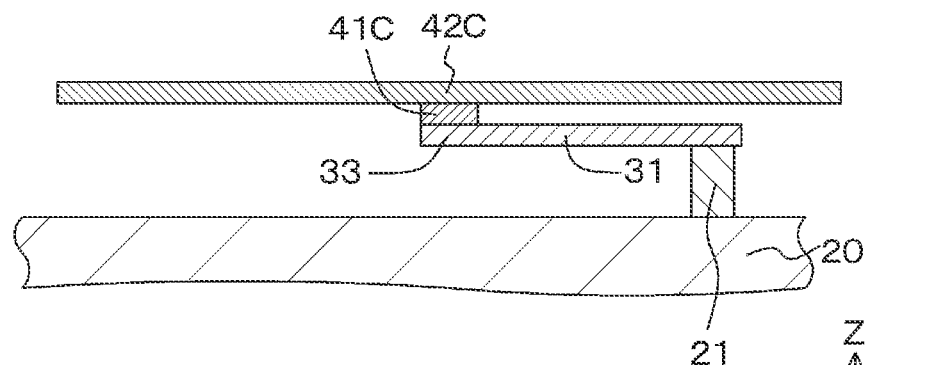
Figure 14C:
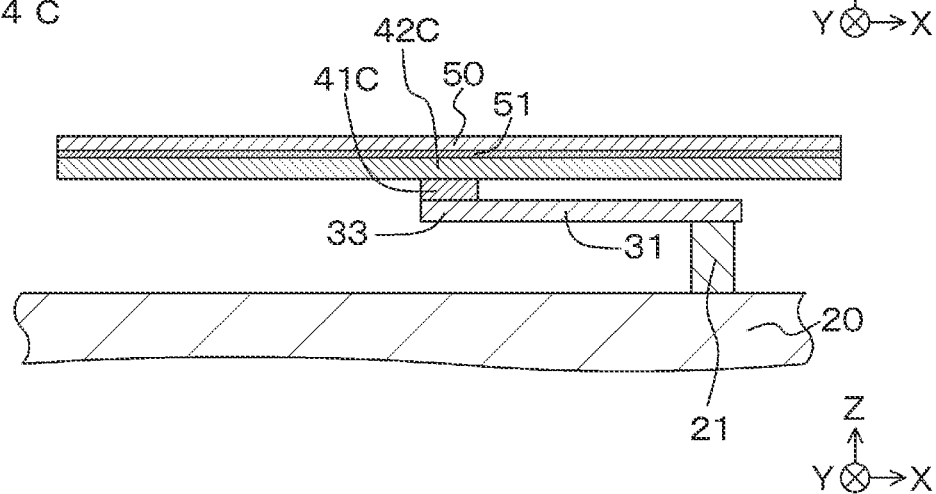
Figure 15:
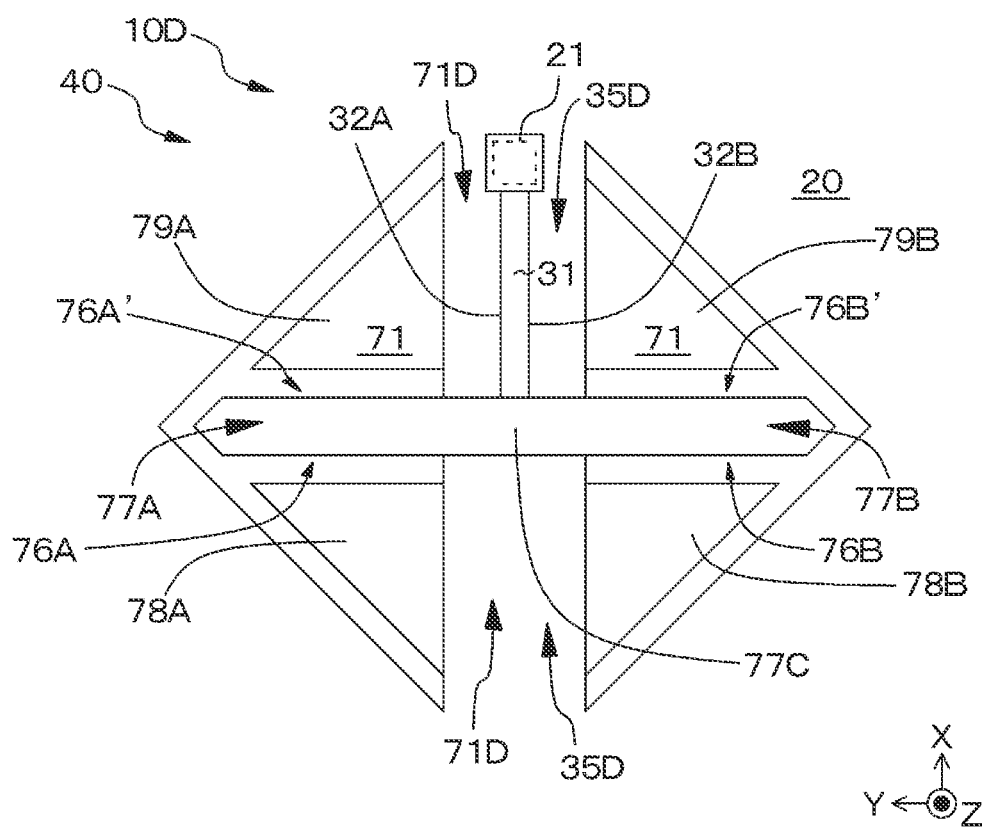
FIG. 15 is a schematic plan view of a lower layer support layer constituting a light reflecting element of a modified example of the third embodiment.
Figure 16:
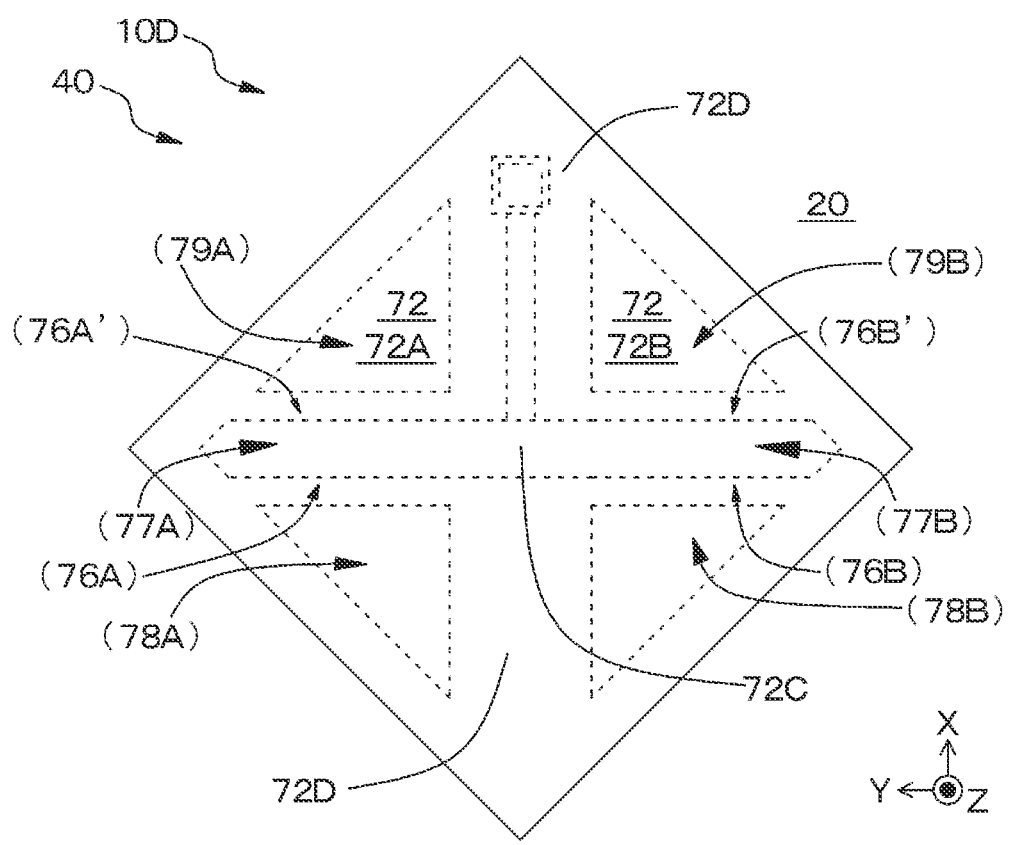
FIG. 16 is a schematic plan view of an upper layer support layer constituting the light reflecting element of the modified example of the third embodiment.

The third embodiment is a modification of the first and second embodiments. FIG. 12A shows a schematic plan view of the support portion and the hinge portion constituting the light reflecting element (modification of the first embodiment) 10C of the third embodiment, FIG. 12B shows a schematic plan view of the lower layer support layer, FIG. 13 shows a schematic plan view of the upper layer support layer constituting the light reflecting element 10C, FIG. 14A shows a schematic end view along arrow A-A in FIG. 12A, FIG. 14B shows a schematic end view along arrow C-C in FIG. 13, and FIG. 14C shows a schematic end view along arrow G-G in FIG. 13 (a schematic end view similar to the one along arrow G-G in FIG. 3, which is a schematic end view of a state in which the base layer 51 and the light reflecting layer 50 are formed on the upper layer support layer 42 constituting the light reflecting element 10C shown in FIG. 13). Further, FIG. 15 shows a schematic plan view of the lower layer support layer constituting the light reflecting element 10D of a modified example of the third embodiment (a modification of the second embodiment), and FIG. 16 shows a schematic plan view of the upper layer support layer constituting the light reflecting element 10D of the modified example of the third embodiment. Also, in FIGS. 13 and 16, illustration of the movable pieces is omitted.

In the light reflecting elements 10C and 10D of the third embodiment, unlike the first and second embodiments, one end of the torsion bar portion 31 is fixed to the support portion 21. That is, one support portion 21 is provided, and the light reflecting elements 10C and 10D of the third embodiment have a cantilever structure. Except for this point, configurations and structures of the light reflecting elements 10C and 10D of the third embodiment can be the same as the configurations and the structures of the light reflecting elements 10A and 10B described in the first and second embodiments, and thus detailed description thereof will be omitted.

Figure 18:
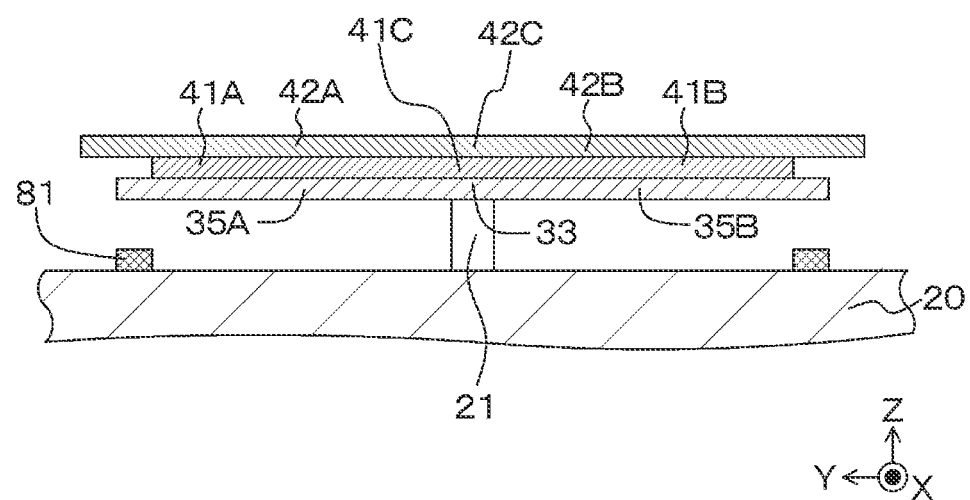
FIG. 18 is a schematic cross-sectional view similar to FIG. 6A, showing a lower layer support layer constituting a light reflecting element of another modified example of the first embodiment.

Although the present disclosure has been described above on the basis of the preferred embodiments, the present disclosure is not limited to these embodiments. The configurations, the structures, the shape of each portion, the materials used, and the manufacturing method of the light reflecting element and the spatial light modulator described in the embodiments are examples and can be appropriately changed. As a schematic cross-sectional view similar to that of FIG. 6A of a lower layer support layer and the like constituting a light reflecting element of another modification of the first embodiment shown in FIG. 18, a stopper 81 may be provided in a region of the base body located below tips of the movable pieces to limit excessive vertical movement of the tips of the movable pieces 35A and 35B.

Further, the present disclosure may also have the following configurations.

[A01]<<Light Reflecting Element>>

A light reflecting element including a support portion provided on a base body, a hinge portion, and a light reflecting portion, wherein
 the light reflecting portion includes a support layer and a light reflecting layer formed on the support layer,
 the hinge portion includes a torsion bar portion, a first extending portion extending from a portion of one side portion of the torsion bar portion, a first movable piece extending from an end portion of the first extending portion, a second extending portion extending from a portion of the other side portion of the torsion bar portion, and a second movable piece extending from an end portion of the second extending portion,
 an end portion of the torsion bar portion is fixed to the support portion, the hinge portion is twistedly deformable around an axis of the torsion bar portion, the support layer is formed to extend from above the first movable piece to above the second movable piece, and a recessed portion is provided at least at a portion of the support layer facing a space located between the first movable piece and the second movable piece.

[A02] The light reflecting element according to [A01], wherein the support layer has a two-layer structure of a lower layer support layer and an upper layer support layer, the lower layer support layer includes a first lower layer support layer, a second lower layer support layer, and a third lower layer support layer, the first lower layer support layer is formed on the first movable piece, the second lower layer support layer is formed on the second movable piece, the third lower layer support layer is formed on the first extending portion, on the second extending portion, and on a portion of the torsion bar portion located between the first extending portion and the second extending portion, and the upper layer support layer is formed to extend from above the first lower layer support layer to above the second lower layer support layer including an above portion of the third lower layer support layer.

[A03] The light reflecting element according to [A02], wherein the upper layer support layer is formed on the first lower layer support layer, the third lower layer support layer, and the second lower layer support layer, and above a space surrounded by the first lower layer support layer, the second lower layer support layer, and the third lower layer support layer.

[A04] The light reflecting element according to [A01], wherein the support layer has a two-layer structure of a lower layer support layer and an upper layer support layer, the lower layer support layer includes a first A lower layer support layer, a first B lower layer support layer, a first C lower layer support layer, a second A lower layer support layer, a second B lower layer support layer, a second C lower layer support layer, and a third lower layer support layer, the first A lower layer support layer is formed on the first movable piece, the first B lower layer support layer and the first C lower layer support layer are separated from a side portion of the first A lower layer support layer and formed on the first movable piece with the first A lower layer support layer interposed therebetween, the second A lower layer support layer is formed on the second movable piece, the second B lower layer support layer and the second C lower layer support layer are separated from a side portion of the second A lower layer support layer and formed on the second movable piece with the second A lower layer support layer interposed therebetween, the first extending portion, the second extending portion, and a portion of the torsion bar portion located between the first extending portion and the second extending portion are located between the first A lower layer support layer and the second A lower layer support layer, the third lower layer support layer is formed on the first extending portion, on the second extending portion, and on the portion of the torsion bar portion located between the first extending portion and the second extending portion, and the upper layer support layer is formed to extend from above the first lower layer support layer to above the second lower layer support layer including an above portion of the third lower layer support layer.

[A05] The light reflecting element according to [A04], wherein the upper layer support layer is formed on the third lower layer support layer, formed to extend from the first B lower layer support layer to the first C lower layer support layer, formed to extend from the second B lower layer support layer to the second C lower layer support layer, formed above a space surrounded by the first B lower layer support layer, the second B lower layer support layer, and the third lower layer support layer, and formed above a space surrounded by the first C lower layer support layer, the second C lower layer support layer, and the third lower layer support layer.

[A06] The light reflecting element according to [A01], wherein the support layer has a two-layer structure of a lower layer support layer and an upper layer support layer, the lower layer support layer includes a first lower layer support layer and a second lower layer support layer, the first lower layer support layer is formed on the first movable piece, the second lower layer support layer is formed on the second movable piece, and the lower layer support layer is not formed to extend on the first extending portion, on the second extending portion, and on the portion of the torsion bar portion located between the first extending portion and the second extending portion.

[A07] The light reflecting element according to [A06], wherein a space present to extend on the first extending portion, on the second extending portion, and on the portion of the torsion bar portion located between the first extending portion and the second extending portion communicates with the recessed portion.

[A08] The light reflecting element according to any one of [A01] to [A07], wherein the recessed portion is provided on a surface of the support layer on a base body side.

[A09] The light reflecting element according to any one of [A01] to [A08], wherein both ends of the torsion bar portion are fixed to the support portion.

[A10] The light reflecting element according to any one of [A01] to [A08], wherein one end of the torsion bar portion is fixed to the support portion.

[A11] The light reflecting element according to any one of [A01] to [A10], wherein the first extending portion and the second extending portion are disposed line-symmetrically with an axis of the torsion bar portion as an axis of symmetry, and the first movable piece and the second movable piece are disposed line-symmetrically with the axis of the torsion bar portion as an axis of symmetry.

[A12] The light reflecting element according to any one of [A01] to [A11], wherein the light reflecting portion covers the support portion.

[A13] The light reflecting element according to any one of [A01] to [A12], wherein an electrode for twistedly deforming the hinge portion around an axis of the torsion bar portion is provided at a portion of the base body facing each of the first movable piece and the second movable piece.

[A14] The light reflecting element according to any one of [A01] to [A13], wherein a stopper is provided in a region of the base body located below tips of the movable pieces.

[B01] <<Spatial Light Modulator>>

A spatial light modulator in which light reflecting elements are arranged in an array, each light reflecting element including a support portion provided on a base body, a hinge portion, and a light reflecting portion,
- wherein the light reflecting portion includes a support layer and a light reflecting layer formed on the support layer,
- the hinge portion includes a torsion bar portion, a first extending portion extending from a portion of one side portion of the torsion bar portion, a first movable piece extending from an end portion of the first extending portion, a second extending portion extending from a portion of the other side portion of the torsion bar portion, and a second movable piece extending from an end portion of the second extending portion,
- an end portion of the torsion bar portion is fixed to the support portion,
- the hinge portion is twistedly deformable around an axis of the torsion bar portion, the support layer is formed to extend from above the first movable piece to above the second movable piece, and
- a recessed portion is provided at least at a portion of the support layer facing a space located between the first movable piece and the second movable piece.

[B02] The spatial light modulator according to [B01], wherein, in each light reflecting element,
- the support layer has a two-layer structure of a lower layer support layer and an upper layer support layer,
- the lower layer support layer includes a first lower layer support layer, a second lower layer support layer, and a third lower layer support layer,
- the first lower layer support layer is formed on the first movable piece,
- the second lower layer support layer is formed on the second movable piece,
- the third lower layer support layer is formed on the first extending portion, on the second extending portion, and on a portion of the torsion bar portion located between the first extending portion and the second extending portion, and
- the upper layer support layer is formed to extend from above the first lower layer support layer to above the second lower layer support layer including an above portion of the third lower layer support layer.

[B03] The spatial light modulator according to [B02], wherein, in each light reflecting element, the upper layer support layer is formed on the first lower layer support layer, the third lower layer support layer and the second lower layer support layer, and above a space surrounded by the first lower layer support layer, the second lower layer support layer, and the third lower layer support layer.

[B04] The spatial light modulator according to [B01], wherein, in each light reflecting element,
- the support layer has a two-layer structure of a lower layer support layer and an upper layer support layer,
- the lower layer support layer incudes a first A lower layer support layer, a first B lower layer support layer, a first C lower layer support layer, a second A lower layer support layer, a second B lower layer support layer, a second C lower layer support layer, and a third lower layer support layer,
- the first A lower layer support layer is formed on the first movable piece,
- the first B lower layer support layer and the first C lower layer support layer are separated from a side portion of the first A lower layer support layer and formed on the first movable piece with the first A lower layer support layer interposed therebetween,
- the second A lower layer support layer is formed on the second movable piece,
- the second B lower layer support layer and the second C lower layer support layer are separated from a side portion of the second A lower layer support layer and formed on the second movable piece with the second A lower layer support layer interposed therebetween,
- the first extending portion, the second extending portion, and a portion of the torsion bar portion located between the first extending portion and the second extending portion are located between the first A lower layer support layer and the second A lower layer support layer, and
- the third lower layer support layer is formed on the first extending portion, on the second extending portion, and on the portion of the torsion bar portion located between the first extending portion and the second extending portion, and
- the upper layer support layer is formed to extend from above the first lower layer support layer to above the second lower layer support layer including an above portion of the third lower layer support layer.

[B05] The spatial light modulator according to [B04], wherein, in each light reflecting element, the upper layer support layer is formed on the third lower layer support layer, formed to extend from the first B lower layer support layer to the first C lower layer support layer, formed to extend from the second B lower layer support layer to the second C lower layer support layer, formed above a space surrounded by the first B lower layer support layer, the second B lower layer support layer, and the third lower layer support layer, and formed above a space surrounded by the first C lower layer support layer, the second C lower layer support layer, and the third lower layer support layer.

[B06] The spatial light modulator according to [B01], wherein, in each light reflecting element,
- the support layer has a two-layer structure of a lower layer support layer and an upper layer support layer,
- the lower layer support layer includes a first lower layer support layer and a second lower layer support layer,
- the first lower layer support layer is formed on the first movable piece,
- the second lower layer support layer is formed on the second movable piece, and the lower layer support layer is not formed to extend on the first extending portion, on the second extending portion, and on the portion of the torsion bar portion located between the first extending portion and the second extending portion.

[B07] The spatial light modulator according to [B06], wherein, in each light reflecting element, the space present to extend on the first extending portion, on the second extending portion, and on the portion of the torsion bar portion located between the first extending portion and the second extending portion communicates with the recessed portion.

[B08] The spatial light modulator according to any one of [B01] to [B07], wherein, in each light reflecting element, the recessed portion is provided on a surface of the support layer on a base body side.

[B09] The spatial light modulator according to any one of [B01] to [B08], wherein, in each light reflecting element, both ends of the torsion bar portion are fixed to the support portion.

[B10] The spatial light modulator according to any one of [B01] to [B08], wherein, in each light reflecting element, one end of the torsion bar portion is fixed to the support portion.

[B11] The spatial light modulator according to any one of [B01] to [B10],
wherein, in each light reflecting element,
the first extending portion and the second extending portion are disposed line-symmetrically with an axis of the torsion bar portion as an axis of symmetry, and the first movable piece and the second movable piece are disposed line-symmetrically with the axis of the torsion bar portion as an axis of symmetry.

[B12] The spatial light modulator according to any one of [B01] to [B11], wherein, in each light reflecting element, the light reflecting portion covers the support portion.

[B13] The spatial light modulator according to any one of [B01] to [B12], wherein, in each light reflecting element, an electrode for twistedly deforming the hinge portion around an axis of the torsion bar portion is provided on a portion of the base body facing each of the first movable piece and the second movable piece.

[B14] The spatial light modulator according to any one of [B01] to [B13], wherein, in each light reflecting element, a stopper is provided in a region of the base body located below tips of the movable pieces.

REFERENCE SIGNS LIST 10A, 10B, 10C, 10D Light reflecting element
11 Spatial light modulator
12 Light source
13 Optical system (lens)
14 Screen
20 Base body
21 Support portion
30 Hinge portion
31 Torsion bar portion
32A One side portion of portion of torsion bar portion
32B Other side portion of portion of torsion bar portion
33 Portion of torsion bar portion located between first extending portion and second extending portion
34A First extending portion
34B Second extending portion
35A First movable piece
35B Second movable piece
35D Space
40 Light reflecting portion
41, 71 Lower layer support layer
41A First lower layer support layer
41B Second lower layer support layer
41C Third lower layer support layer
41D Recessed portion (space)
41E Second recessed portion
71D Recessed portion (space)
42, 72 Upper layer support layer
42A, 72A First upper layer support layer
42B, 72B Second upper layer support layer
42C, 72C Third upper layer support layer
42D, 72D Region of upper layer support layer located above recessed portion 41D
50 Light reflecting layer
51 Base layer
70 Support layer
76A Gap present in region between first B lower layer support layer and side portion of first A lower layer support layer
76A' Gap present in region between first C lower layer support layer and side portion of first A lower layer support layer
76B Gap present in region between second B lower layer support layer and side portion of second A lower layer support layer
76B' Gap present in region between second C lower layer support layer and side portion of second A lower layer support layer
77A First A lower layer support layer
78B First B lower layer support layer
79C First C lower layer support layer
77B Second A lower layer support layer
78B Second B lower layer support layer
79C Second C lower layer support layer
80 Electrode
81 Stopper

What is claimed is:
1. A light reflecting element, comprising:
a base body;
a support portion provided on the base body;
a hinge portion; and
a light reflecting portion,
wherein the light reflecting portion includes:
 a support layer; and
 a light reflecting layer formed on the support layer,
wherein the hinge portion includes:
 a torsion bar portion;
 a first extending portion extending from a portion of one side portion of the torsion bar portion;
 a first movable piece extending from an end portion of the first extending portion;
 a second extending portion extending from a portion of the other side portion of the torsion bar portion; and
 a second movable piece extending from an end portion of the second extending portion,
wherein an end portion of the torsion bar portion is fixed to the support portion,
wherein the hinge portion is twistedly deformable around an axis of the torsion bar portion,
wherein the support layer is formed to extend from above the first movable piece to above the second movable piece,
wherein a recessed portion is provided at least at a portion of the support layer facing a space located between the first movable piece and the second movable piece,
wherein the support layer has a two-layer structure of a lower layer support layer and an upper layer support layer,
wherein the lower layer support layer includes a first A lower layer support layer, a first B lower layer support layer, and a first C lower layer support layer, a second A lower layer support layer, a second B lower layer support layer, and a second C lower layer support layer, and a third lower layer support layer,
wherein the first A lower layer support layer is formed on the first movable piece, wherein the first B lower layer support layer and the first C lower layer support layer are separated from a side portion of the first A lower layer support layer and formed on the first movable piece with the first A lower layer support layer interposed therebetween, wherein the second A lower layer support layer is formed on the second movable piece, and wherein the second B lower layer support layer and the second C lower layer support layer are separated from a side portion of the second A lower layer support layer and formed on the second movable piece with the second A lower layer support layer interposed therebetween.

2. The light reflecting element according to claim 1, wherein the first extending portion, the second extending portion, and a portion of the torsion bar portion located between the first extending portion and the second extending portion are located between the first A lower layer support layer and the second A lower layer support layer, wherein the third lower layer support layer is formed on the first extending portion, on the second extending portion, and on the portion of the torsion bar portion located between the first extending portion and the second extending portion, and wherein the upper layer support layer is formed to extend from above the first lower layer support layer to above the second lower layer support layer including an above portion of the third lower layer support layer.

3. The light reflecting element according to claim 1, wherein the upper layer support layer is formed on the third lower layer support layer, formed to extend from the first B lower layer support layer to the first C lower layer support layer, formed to extend from the second B lower layer support layer to the second C lower layer support layer, and formed above a space surrounded by the first B lower layer support layer, the second B lower layer support layer, and the third lower layer support layer.

4. The light reflecting element according to claim 1, wherein the recessed portion is provided on a surface of the support layer on a base body side.

5. The light reflecting element according to claim 1, wherein both ends of the torsion bar portion are fixed to the support portion.

6. The light reflecting element according to claim 1, wherein one end of the torsion bar portion is fixed to the support portion.

7. The light reflecting element according to claim 1, wherein the first extending portion and the second extending portion are disposed line-symmetrically with an axis of the torsion bar portion as an axis of symmetry, and the first movable piece and the second movable piece are disposed line-symmetrically with the axis of the torsion bar portion as an axis of symmetry.

8. The light reflecting element according to claim 1, wherein the light reflecting portion covers the support portion.

9. The light reflecting element according to claim 1, wherein an electrode for twistedly deforming the hinge portion around an axis of the torsion bar portion is provided at a portion of the base body facing each of the first movable piece and the second movable piece.

10. The light reflecting element according to claim 1, wherein a stopper is provided in a region of the base body located below tips of the movable pieces.

11. A spatial light modulator in which light reflecting elements are arranged in an array, each light reflecting element including:

a base body;

a support portion provided on a base body;

a hinge portion; and a light reflecting portion, wherein the light reflecting portion includes:

a support layer; and a light reflecting layer formed on the support layer, wherein the hinge portion includes:

a torsion bar portion;

a first extending portion extending from a portion of one side portion of the torsion bar portion;

a first movable piece extending from an end portion of the first extending portion, a second extending portion extending from a portion of the other side portion of the torsion bar portion; and a second movable piece extending from an end portion of the second extending portion, wherein an end portion of the torsion bar portion is fixed to the support portion, wherein the hinge portion is twistedly deformable around an axis of the torsion bar portion, wherein the support layer is formed to extend from above the first movable piece to above the second movable piece, wherein a recessed portion is provided at least at a portion of the support layer facing a space located between the first movable piece and the second movable piece, wherein the support layer has a two-layer structure of a lower layer support layer and an upper layer support layer, wherein the lower layer support layer includes a first A lower layer support layer, a first B lower layer support layer, and a first C lower layer support layer, a second A lower layer support layer, a second B lower layer support layer, and a second C lower layer support layer, and a third lower layer support layer, wherein the first A lower layer support layer is formed on the first movable piece, wherein the first B lower layer support layer and the first C lower layer support layer are separated from a side portion of the first A lower layer support layer and formed on the first movable piece with the first A lower layer support layer interposed therebetween, wherein the second A lower layer support layer is formed on the second movable piece, and wherein the second B lower layer support layer and the second C lower layer support layer are separated from a side portion of the second A lower layer support layer and formed on the second movable piece with the second A lower layer support layer interposed therebetween.

12. The spatial light modulator according to claim 11, wherein the upper layer support layer is formed above a space surrounded by the first C lower layer support layer, the second C lower layer support layer, and the third lower layer support layer.

13. The spatial light modulator according to claim 11, wherein the first extending portion, the second extending portion, and a portion of the torsion bar portion located between the first extending portion and the second extending portion are located between the first A lower layer support layer and the second A lower layer support layer, wherein the third lower layer support layer is formed on the first extending portion, on the second extending portion, and on the portion of the torsion bar portion located between the first extending portion and the second extending portion, and wherein the upper layer support layer is formed to extend from above the first lower layer support layer to above the second lower layer support layer including an above portion of the third lower layer support layer.

14. The spatial light modulator according to claim 11, wherein the upper layer support layer is formed on the third lower layer support layer, formed to extend from the first B lower layer support layer to the first C lower layer support layer, formed to extend from the second B lower layer support layer to the second C lower layer support layer, and formed above a space surrounded by the first B lower layer support layer, the second B lower layer support layer, and the third lower layer support layer.

15. The spatial light modulator according to claim 11, wherein the recessed portion is provided on a surface of the support layer on a base body side.

16. The spatial light modulator according to claim 11, wherein both ends of the torsion bar portion are fixed to the support portion.

17. The spatial light modulator according to claim 11, wherein one end of the torsion bar portion is fixed to the support portion.

18. The spatial light modulator according to claim 11, wherein a stopper is provided in a region of the base body located below tips of the movable pieces.

19. A light reflecting element, comprising:
a base body;
a support portion provided on the base body;
a hinge portion; and
a light reflecting portion,
wherein the light reflecting portion includes:
  a support layer; and
  a light reflecting layer formed on the support layer,
wherein the hinge portion includes:
  a torsion bar portion;
  a first extending portion extending from a portion of one side portion of the torsion bar portion;
  a first movable piece extending from an end portion of the first extending portion;
  a second extending portion extending from a portion of the other side portion of the torsion bar portion; and
  a second movable piece extending from an end portion of the second extending portion,
wherein an end portion of the torsion bar portion is fixed to the support portion,
wherein the hinge portion is twistedly deformable around an axis of the torsion bar portion,
wherein the support layer is formed to extend from above the first movable piece to above the second movable piece,
wherein a recessed portion is provided at least at a portion of the support layer facing a space located between the first movable piece and the second movable piece,
wherein the support layer has a two-layer structure of a lower layer support layer and an upper layer support layer,
wherein the lower layer support layer includes a first A lower layer support layer, a first B lower layer support layer, and a first C lower layer support layer, a second A lower layer support layer, a second B lower layer support layer, and a second C lower layer support layer, and a third lower layer support layer,
wherein the upper layer support layer is formed on the third lower layer support layer, formed to extend from the first B lower layer support layer to the first C lower layer support layer, formed to extend from the second B lower layer support layer to the second C lower layer support layer, formed above a space surrounded by the first B lower layer support layer, the second B lower layer support layer, and the third lower layer support layer, and formed above a space surrounded by the first C lower layer support layer, the second C lower layer support layer, and the third lower layer support layer.

20. The light reflecting element according to claim 1, wherein the upper layer support layer is formed above a space surrounded by the first C lower layer support layer, the second C lower layer support layer, and the third lower layer support layer.

* * * * *